(12) United States Patent
Kitamoto et al.

(10) Patent No.: US 6,421,292 B1
(45) Date of Patent: Jul. 16, 2002

(54) SEMICONDUCTOR MEMORY, AND MEMORY ACCESS METHOD

(75) Inventors: Ayako Kitamoto; Masato Matsumiya; Shinichi Yamada; Masato Takita, all of Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/892,748

(22) Filed: Jun. 28, 2001

(30) Foreign Application Priority Data

Dec. 4, 2000 (JP) ........................................ 2000-368423

(51) Int. Cl.$^7$ ................................................ G11C 7/00
(52) U.S. Cl. .............. 365/222; 365/189.04; 365/189.07
(58) Field of Search ........................... 365/222, 189.07, 365/230.03, 189.04; 711/105, 106

(56) References Cited

U.S. PATENT DOCUMENTS 5,184,325 A * 2/1993 Lipovski ..................... 365/222
5,469,555 A * 11/1995 Ghosh et al. ................ 711/133
5,999,474 A  12/1999 Leung et al. ................ 365/222

OTHER PUBLICATIONS

Nogami et al. "1–Mbit Virtually Static RAM," IEEE Journal of Solid–State Circuits, vol. SC–21, No. 5, Oct. 1996, pp. 662–667.

* cited by examiner

Primary Examiner—Son Mai
(74) Attorney, Agent, or Firm—Arent Fox Kintner Plotkin & Kahn

(57) ABSTRACT

In the semiconductor memory, a refresh signal is generated and the refresh operation is performed based on the refresh signal. Parity is generated when data is written and the generated parity is stored. When the refresh operation and a usual data read or write operation overlap, data in a memory cell which cannot be read because the refresh operation is given priority is determined based on the parity. Data which cannot be written because the refresh operation is given priority is held temporarily in a write data buffer. When the refresh operation is not overlapped for the usual data read or write operation, the data held in the write data buffer is rewritten in a corresponding memory cell.

20 Claims, 26 Drawing Sheets

SEMICONDUCTOR MEMORY, AND MEMORY ACCESS METHOD

FIELD OF THE INVENTION

The present invention relates to a semiconductor memory constituted of a memory cell requiring a refresh operation. Furthermore, this invention relates to a technique for freeing a semiconductor memory from the refresh operation in a method of memory for accessing such a semiconductor memory.

BACKGROUND OF THE INVENTION

In semiconductor memories, it is necessary that an external refresh operation command is input periodically to perform a refresh operation to supplement charge lost from a memory cell by current leakage. DRAM is an example of such semiconductor memory. This refresh operation and memory access, such as usual read and write, cannot be performed at the same time and, therefore, the usual memory access is performed after the refresh operation is finished. This gives rise to a time zone during which the usual memory access cannot be performed on account of the execution of the refresh operation. In addition, because it is necessary to control the timing between the refresh operation and the usual memory access, this imposes a heavy burden for a memory controller.

Conventional techniques for freeing a memory from a refresh operation have been proposed in semiconductor memories requiring a refresh operation. For example, a technique for freeing a semiconductor memory from there fresh operation by using a cache memory is known (see U.S. Pat. No. 5,999,474).

However, the aforementioned conventional techniques have the problem that the hit or miss of the cache causes a difference in the speed of the read operation and in the speed of the write operation. Furthermore, if a large cache memory is disposed to decrease the rate of cache miss, this brings about the disadvantages that the semiconductor memory is large-scaled or the degree of integration is decreased.

SUMMARY OF THE INVENTION

It is an object of this invention to provide a semiconductor memory requiring a refresh operation and a method of memory for accessing such a semiconductor memory. Furthermore, is it an object of this invention to provide a semiconductor memory which is freed from the refresh operation and a method for making it possible to free a semiconductor memory from the refresh operation without using a cache memory.

According to the present invention, a refresh operation is performed on the basis of a refresh signal generated in the inside of a semiconductor memory, a parity is stored together with data, and the data of a memory cell which cannot be read because a refresh operation is given priority when the refresh operation and the data read operation are to be performed at the same time is determined based on the parity and the data for memory cell which cannot be written because a refresh operation is given priority when the refresh operation and the data write operation are to be performed at the same time is stored and held temporarily in a separate memory area and the held data is rewritten afterward in the proper memory cell.

Thus, when the necessities for a refresh operation and for reading or writing of data arise at the same time, the data of a memory cell which cannot be read is determined by a parity and the data for memory cell which cannot be written is rewritten in the proper memory cell after it is stored and held temporarily in a separate area. Therefore, the refresh operation can be freed without using the cache memory.

Other objects and features of this invention will become apparent from the following description with reference to the accompanying drawings.

DESCRIPTION OF THE PREFERRED EMBODIMENTS

Preferred embodiments of a semiconductor memory and a memory access method according to the present invention will be explained in detail below with reference to the accompanying drawings.

Figure 1:
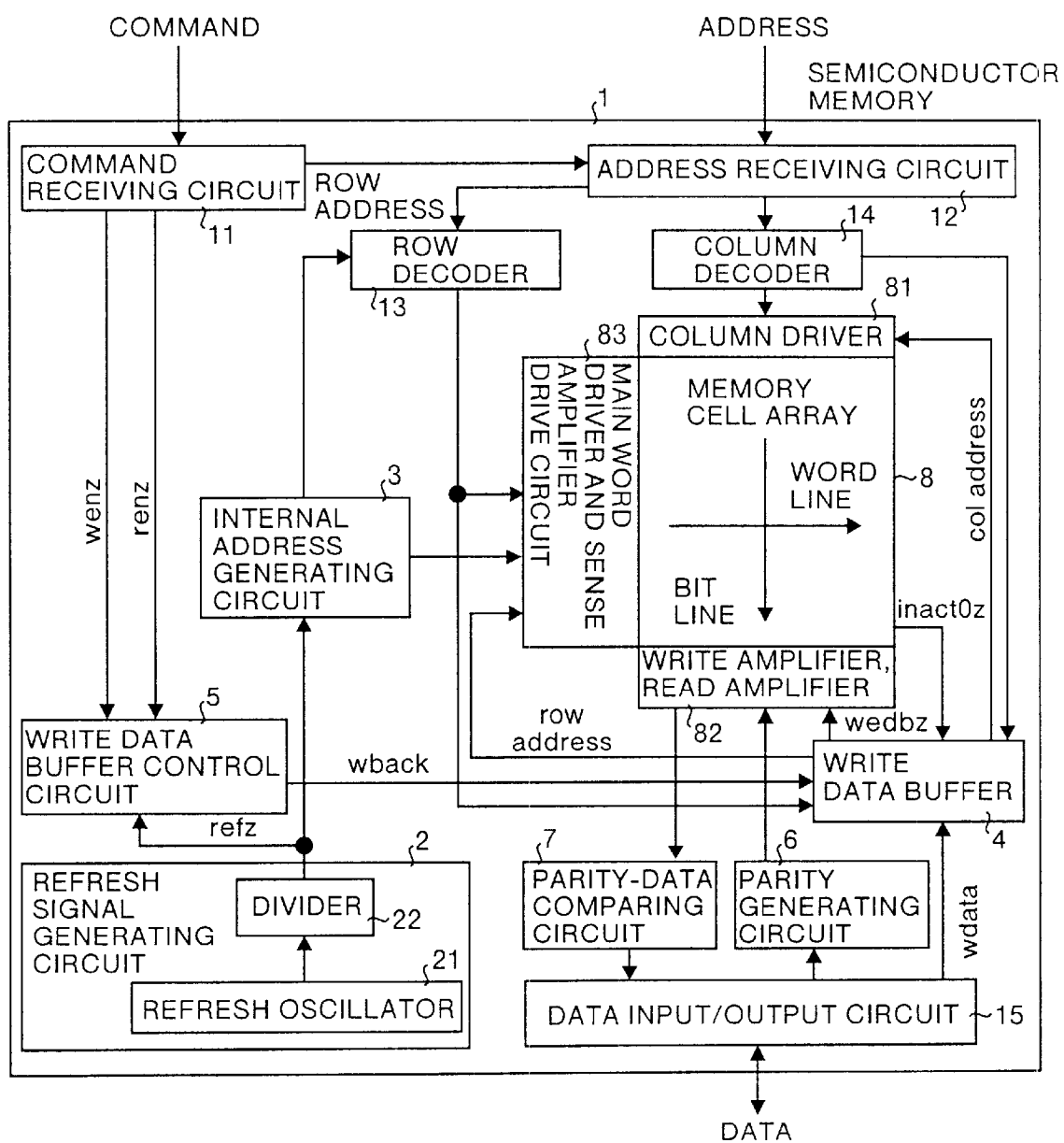
FIG. 1 is a block diagram showing the structure of a semiconductor memory according to a first embodiment of the present invention.

FIG. 1 is a block diagram showing the structure of a semiconductor memory according to a first embodiment of the present invention. This semiconductor memory 1 is provided with a command receiving circuit 11, an address receiving circuit 12, a row decoder 13, a column decoder 14, a data input and output circuit 15, a refresh signal generating circuit 2 and an internal address generating circuit 3 which corresponds to a refresh signal generating unit, a write data buffer 4 which is a memory area, a write data buffer control circuit 5 which corresponds to a rewrite control unit, a parity generating circuit 6 which corresponds to a parity generating unit, a parity/data comparing circuit 7 which corresponds to a parity/data comparing unit, a memory cell array 8, a column driver 81, a data bus amplifier section 82 including a write amplifier and a read amplifier and a main word drivers and sense amplifier drive circuit 83.

Further, the refresh signal generating circuit 2 is constituted of a refresh oscillator 21 and a divider 22. The command receiving circuit 11 outputs a control signal for receiving an address in the address receiving circuit 12 in time to commands for reading and writing data received from, for example, an external CPU. The received address is decoded by the row decoder 13 and the column decoder 14 and supplied to the main word drivers and sense amplifier drive circuit 83 and the column driver 81.

The semiconductor memory 1 according to the first embodiment has the following structure. Specifically, a refresh signal is generated in the semiconductor memory 1 and a refresh operation is performed based on the refresh signal. When data is written, a parity is generated and stored. When a refresh operation and a usual data read or write operation are performed at the same time, a sub-array as a subject of refresh the is given priority. For this reason, a parity is generated on the assumption that the data of a memory cell which cannot be read at the time of data read-out is 1 (maybe 0) and the generated parity is compared with the parity stored at the time of data write-in to determine the value of data assumed as 1 (or 0).

The data which cannot be written in a memory cell since a sub-array as a subject of the refresh is given priority is stored and held temporarily in the write data buffer 4. When the refresh operation is not overlapped on the usual data read or write operation, the data held in the write data buffer 4 is rewritten in a corresponding memory cell.

Figure 2:
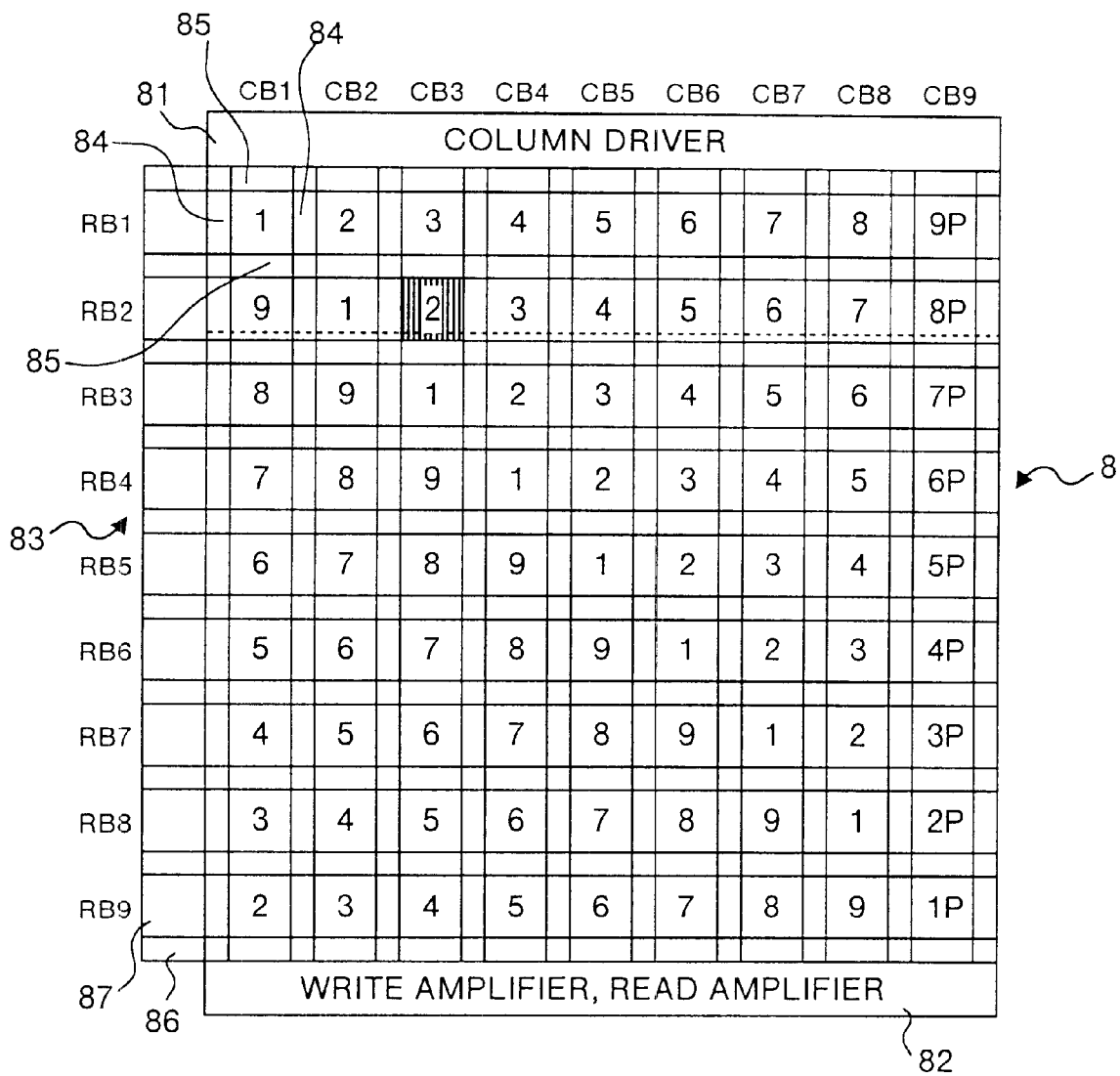
FIG. 2 is a diagram for explaining one example of the structure of a memory cell array in a semiconductor memory according to the first embodiment of the present invention.

FIG. 2 is a diagram for explaining one example of the structure of the memory cell array 8. The memory cell array 8 has, though not necessarily limited to, a structure in which, for example, 81 sub-arrays which are arranged like a matrix of size 9 (row)×9 (column). Each sub-array has a structure in which plural memory cells are arranged matrix-like, though not particularly illustrated. For example, nine sub-arrays constitute one block. Namely, the memory cell array 8 is constituted of 9 blocks. Here, the block means a unit to which memory access is given at the same time when data is written or read.

In the example shown in FIG. 2, the block 1 is constituted of 8 sub-arrays shown as "1" and one sub-array for parity shown as "1P" in the figure. Similarly, the block 2 is constituted of 8 sub-arrays shown as "2" and one sub-array for parity shown as "2P" in the figure. This is the same for block 3 to block 9. In each of the blocks 1 to 9, each one of 9 sub-arrays contained in the same block is arranged in each of the first to ninth block rows (hereinafter referred to as RB1 to RB9) and in each of the first to ninth block columns (hereinafter referred to as CB1 to CB9). Here, the block row means a row consisting of sub-arrays forming a line in a row direction (the direction of a word line) and the block column means a column forming a line in a column direction (the direction of a bit line).

Here, a sub-array defined by the point where a block row RBi crosses a block column CBj (i, j=1, 2, . . . , 9) is expressed by RBi*CBj, for the sake of convenience, to explain the positions of sub-arrays of each block of the memory cell array 8 in detail. For example, as shown in FIG. 2, the nine sub-arrays constituting the block 1 are RB1*CB1, RB2*CB2, RB3*CB3, RB4*CB4, RB5*CB5, RB6*CB6, RB7*CB7, RB8*CB8 and RB9*CB9. Among these sub-arrays, RB9*CB9 is a sub-array for storing the parity of the block 1.

The nine sub-arrays constituting the block 2 are RB1*CB2, RB2*CB3, RB3*CB4, RB4*CB5, RB5*CB6, RB6*CB7, RB7 *CB8, RB8*CB9 and RB9*CB1. Among these sub-arrays, RB8*CB9 is a sub-array for storing the parity of the block 2. The nine sub-arrays constituting the block 3 are RB1*CB3, RB2*CB4, RB3*CB5, RB4*CB6, RB5*CB7, RB6*CB8, RB7 *CB9, RB8*CB1 and RB9*CB2. Among these sub-arrays, RB7*CB9 is a sub-array for storing the parity of the block 3. This is the same for blocks 4 to 9.

Precisely, when k is an integer from 1 to 9, the nine sub-arrays constituting a block k are RB1*CBk, RB2*CB(k+1) RB3*CB(k+2), RB4*CB(k+3), RB5*CB(k+4), RB6*CB(k+5), RB7*CB(k+6), RB8*CB(k+7) and RB9*CB(k+8). If the numeral (namely, the sum of k and 1 to 8) appended behind CB exceeds 9, it is set to a value obtained by subtracting 9 from the numeral. Among these sub-arrays, RB(10-k)*CB9 is a sub-array for storing the parity of the block k. Incidentally, in the first embodiment, the memory cell array 8 is constituted of 8 blocks and, therefore, the block 9 may be used for a redundant sub-array for storing a parity or the like.

Each sub-array is surrounded by sub-word drivers 84 and sense amplifiers 85. Although not particularly illustrated, one column selective line rises in each region sandwiched by each sub-word drivers 84 and data determined in number per each column selective line is output. For instance, in the case of the structure in which data of 2 bits or 4 bits per one column selective line is output, the number of bits of the output data is 16 bits or 32 bits since the memory cell array 8 has the structure of 8 blocks. In the main word drivers and sense amplifier drive circuit 83, a sense amplifier drive signal generating circuit group 86 and main word drivers 87 are arranged.

In the first embodiment, the refresh operation is performed in the unit of sub-array. FIG. 2 shows a case in which the sub-array positioned at RB2*CB3 of the block 2 is a subject of the refresh. Because the structure shown in FIG. 2 is provided with 9 sub-arrays per one block, the refresh operation is performed at an interval of 1/9 of that of the conventional case where the refresh operation is performed in the unit of block. In other words, an oscillation signal generated in a refresh oscillator 21 is divided by a divider 22 so that the frequency is 9 times higher than that of a conventional signal used for controlling refresh timing.

Based on a refresh signal refz output from the refresh signal generating circuit 2, for example count-up of a counter in the internal address generating circuit 3 is made, whereby row addresses for activating a sub-array which is a subject of the refresh are generated successively. These generated row addresses are decoded by the row decoder 13 and supplied to the main word drivers and sense amplifier drive circuit 83.

Figure 3:
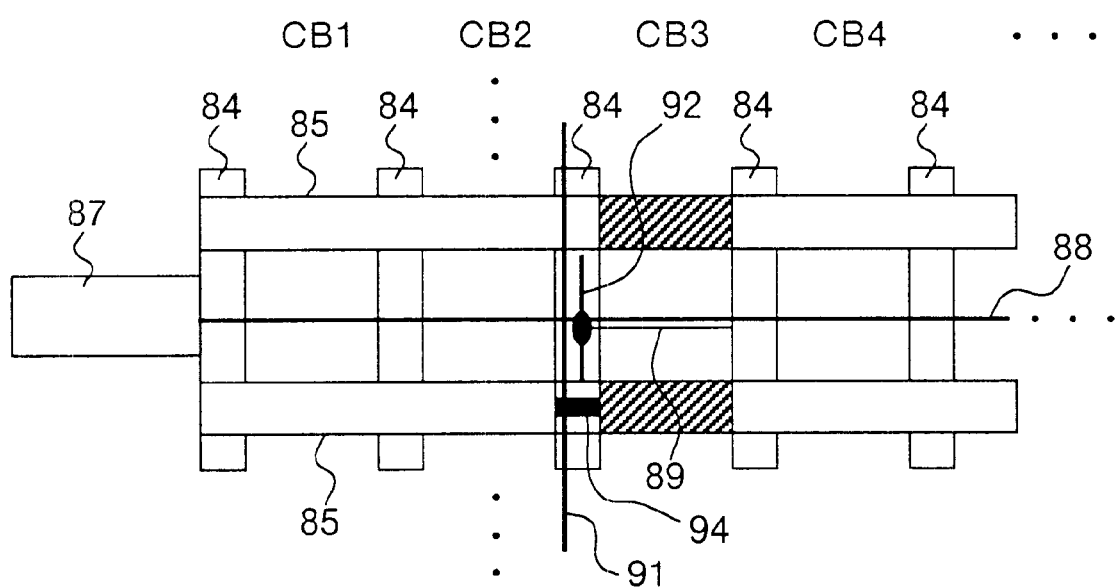
FIG. 3 is a diagram for explaining one example of the hierarchical structure of a word line in a semiconductor memory according to the first embodiment of the present invention.

FIG. 3 is a diagram for explaining one example of the hierarchical structure of a word line and shows a section of 4 blocks of one block row. The number of main word lines 88 provided per one block row is, for example, 64. The main word lines 88 are driven by a main word drivers 87 over the entire of 9 sub-arrays lined on the block row on which the main word lines 88 are wired. The number of sub-word lines 89 provided per one main word line 88 is, for example, 4 or 8. The sub-word line 89 is selected by a sub-word line selective signal 91 supplied from the sub-word drivers 84 and driven only in an individual sub-array by a selective sub-word line drive signal 92. Namely, in the first embodiment, the memory cell array 8 is activated in the unit of sub-array.

The generation of the sub-word line selective signal 91, when a usual data write or read operation is performed, is separated from that when a refresh operation is performed. As to the refresh operation, a structure in which the sub-word line 89 is selected in order by a method other than the above methods may be adopted. The sub-word line selective signal 91 is supplied from the row decoder 13 and the selective sub-word line drive signal 92 is supplied from a circuit 94 which generates the selective sub-word line drive signal 92. Also, the selection of the main word line 88 is made by a selective signal supplied from the row decoder 13.

Figure 4:
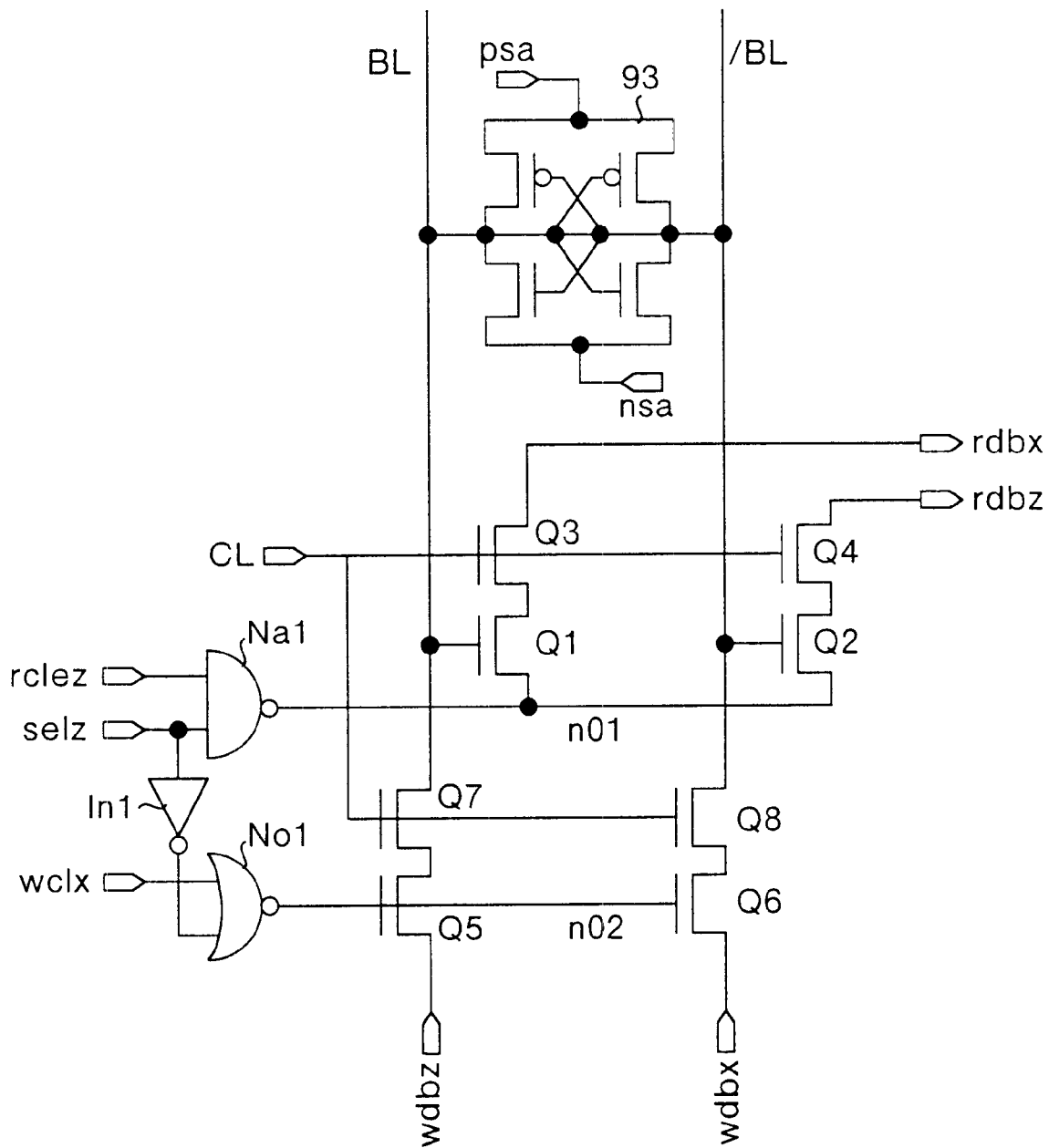
FIG. 4 is a circuit diagram showing an essential part of the electric connection between sense amplifiers and data buses in a semiconductor memory according to the first embodiment of the present invention.
Figure 5:
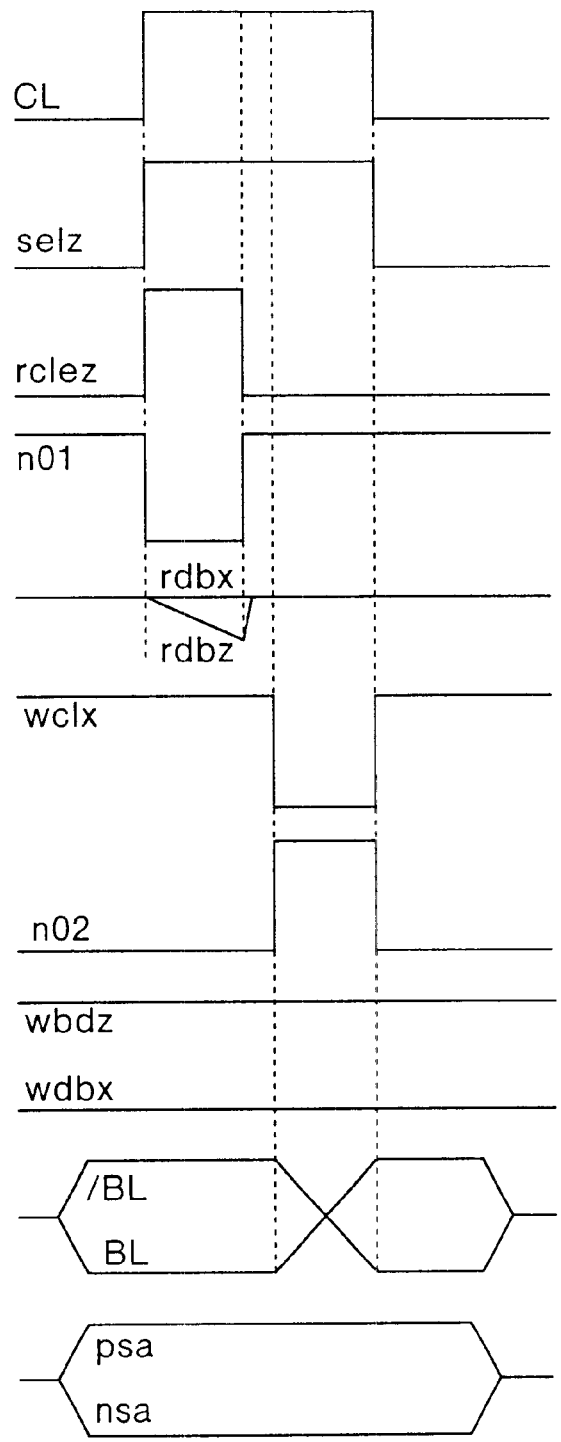
FIG. 5 is a diagram showing a logical relationship between each signal as to the circuit shown in FIG. 4.

FIG. 4 is a circuit diagram showing the essential part of the electric connection between the sense amplifiers and the data bus. FIG. 5 is a diagram showing a logical relationship between each signal in the circuit shown in FIG. 4. However, in FIG. 5, no operational timing is taken into consideration. In FIG. 4 and FIG. 5, BL and /BL represent bit lines (or bit line potential) and n01 and n02 represent nodes (or its potential) provided for the sake of convenience. Furthermore, rdbx and rdbz represent data signals which are supplied to the data buses when data is read, wdbx and wdbz represent data signals which are supplied to the data buses when data is written, psa and nsa represent sense amplifiers activating signals, CL represents a column selective signal, rclez represents sense amplifier column selective signal when data is read, wclx represents sense amplifier selective signal when data is written, and selz represents a sub-array selective signal.

The sub-array selective signal selz is a signal for activating the sense amplifier column in the unit of sub-array. The column selective signal CL is supplied from the column decoder 14. The sense amplifier column selective signal rclez and wclx and the sub-array selective signal selz are supplied from the row decoder 13.

The sub-array selective signal selz and the sense amplifier column selective signal rclez when data is read are input into a NAND gate Na1. The output terminal of the NAND gate Ma1 (corresponding to the node n01) is connected to each source of a transistor Q1 and a transistor Q2. The gate of each of the transistor Q1 and the transistor Q2 is connected to the bit line BL and the bit line /BL respectively. The drain output of each of these transistors Q1 and Q2 is output as the data signals rdbx and rdbz respectively through a transistor Q3 and a transistor Q4 to which the column selective signal CL as an input into the gate when data is output.

The sub-array selective signal selz is inverted by an inverter In1. The inverted signal of the sub-array selective signal selz is input into a NOR gate No1 together with the sense amplifier column selective signal wclx generated when data is written. The output terminal (corresponding to the node n02) of the NOR gate No1 is connected to the gate of each of the transistor Q5 and the transistor Q6. The data signals wdbz and wdbx generated when data is written are supplied to the source of each of the transistor Q5 and the transistor Q6, respectively. The drain of each of the transistor Q5 and the transistor Q6 is connected to the bit line BL and the bit line /BL, respectively, through a transistor Q7 and a transistor Q8 which, respectively, receive the column selective signal CL as an input into the gate. The output signal of the NAND gate Na1 and the output signal of the inverter In1 and NOR gate No1, namely n01 and n02 may be common to plural sense amplifiers.

The sense amplifier latch 93 connected to the bit lines BL and /BL is activated when the sense amplifier activating signal psa is in the state of a relatively high potential level "H" and the sense amplifier activating signal nsa is in the state of a relatively low potential level "L". As shown in FIG. 5, if the column selective signal CL, the sub-array selective signal selz and the sense amplifier column selective signal rclez when data is read are all put in the "H" state when the sense amplifier latch 93 is activated, the potential level of the node n01 is "L". A potential difference corresponding to a potential difference between the bit line BL and the bit line/BL, is thereby, developed between the data signals rdbx and rdbz which are supplied to the data buses. As a consequence, the data of an object memory cell is read from the sense amplifier for which the CL line is "H" among the sub-arrays selected by the sub-array selective signal selz.

On the other hand, if the column selective signal CL and the sub-array selective signal selz are both put in the "H" state and the sense amplifier column selective signal wclx when data is written is put in the "L" state when the sense amplifier latch 93 is activated, the potential level of the node n02 is "H". Write data is, thereby, supplied to the bit line BL and the bit line/BL as the data signals wdbz and wdbx. As a consequence, the data is written in an object memory cell from the sense amplifier for which the column selective signal CL is "H" among the sub-arrays selected by the sub-array selective signal selz.

Figure 6:
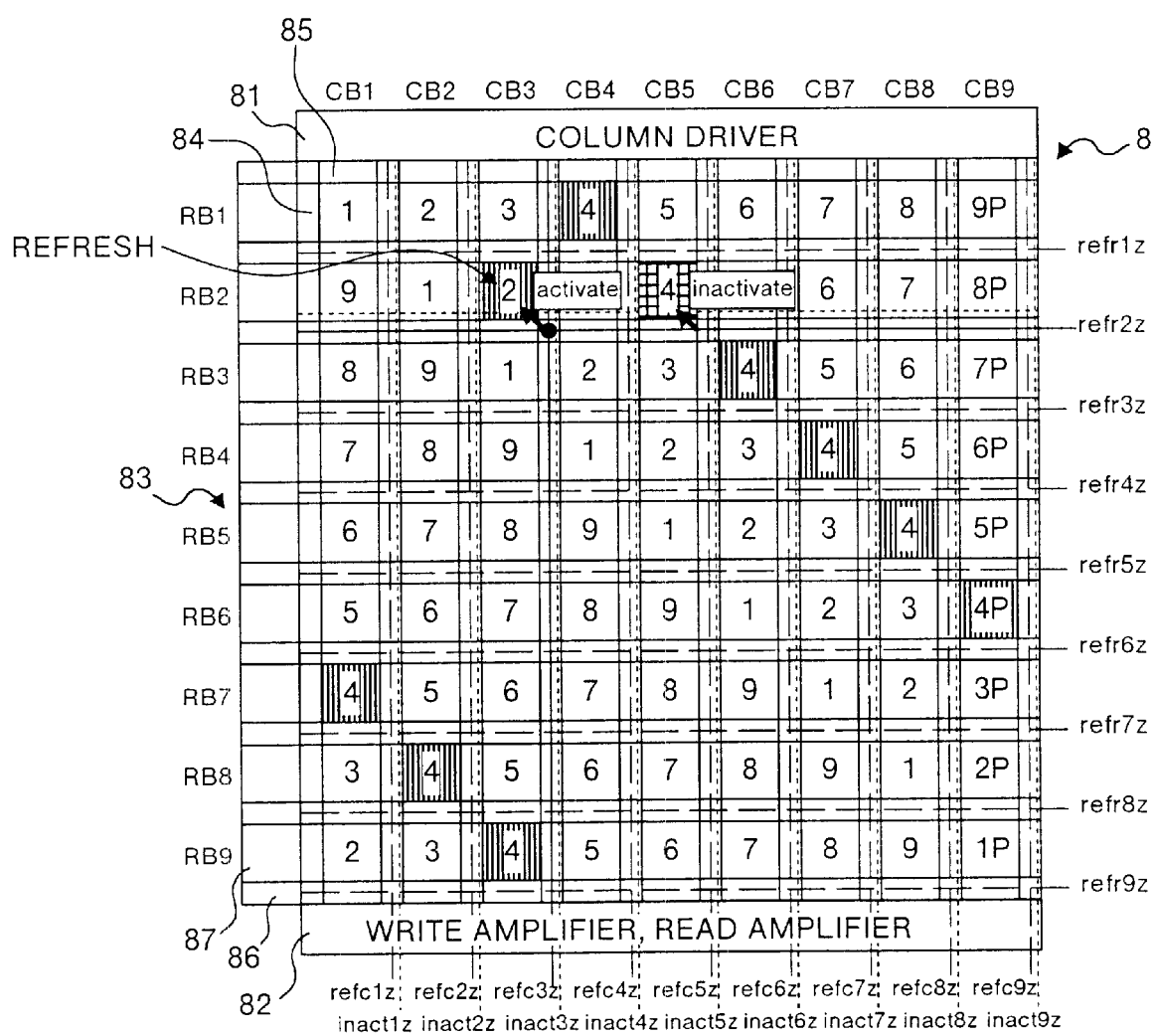
FIG. 6 is a diagram for explaining one example of a mechanism for selecting a sub-array which is a subject of refresh in a semiconductor memory according to the first embodiment of the present invention.

FIG. 6 is a diagram for explaining one example of a mechanism for selecting a sub-array which is being refreshed. The memory cell array 8 is provided with signal lines for supplying row direction refresh enable signals refr1z to refr9z in each block row of RB1 to RB9. The memory cell array 8 is also provided with signal lines for supplying column direction refresh enable signals refc1z to refc9z in each block column of CB1 to CB9. A sub-array to which the row direction refresh enable signal refr#z and the column direction refresh enable signal refc#z are supplied is a subject of refresh.

Here, # means numerals from 1 to 9. The row direction refresh enable signal refr#z and the column direction refresh enable signal refc#z are supplied from the internal address generating circuit 3. The internal address generating circuit 3 is provided with, for example, a counter and by the count-up of the counter, the row direction refresh enable signal refr#z and the column direction refresh enable signal refc#z are activated in order.

In the example shown in FIG. 6, because the second row direction refresh enable signals refr2z and the third column direction refresh enable signals refc3z are supplied, the sub-array of RB2*CB3 is a subject of the refresh. Therefore, the sub-array of RB2*CB3 is activated for the execution of a refresh operation. It is to be noted that a sub-array which is a subject of the refresh can be selected by a combination of the row direction refresh enable signal refr#z and a block number instead of using the column direction refresh enable signal refc#z.

Further, as shown in FIG. 6, the memory cell array 8 is provided with signal lines for supplying non-activating signals inact1z to inact9z to each block column of CB1 to CB9. The non-activating signal inact#z is activated corresponding to a sub-array which is not allowed to conduct the usual data write or read operation due to the refresh operation. The non-activating signal inact#z is generated in the memory cell array 8.

In the example shown in FIG. 6, the refresh operation for the sub-array of RB2*CB3 and the data write operation in the block 4 are performed at the same time. In this case, because the sub-array of RB2*CB3 is activated, as aforementioned, by the refresh operation, a sub-array positioned at the block row of RB2 among sub-arrays included in the block 4, specifically, the sub-array of RB2*CB5 is not activated. The non-activating signal inact5z corresponding to the sub-array of RB2*CB5 is activated to be put in the "H" state instead. By this operation, information specified is resultantly held in the write data buffer 4 corresponding to the block column CB5.

The aforementioned write data buffer control circuit 5 generates a rewrite enable signal wback which is a control signal, used for rewriting the data held in the write data buffer 4, in a corresponding memory cell when the refresh operation and the data read operation or the refresh operation and the data write operation are not performed at the same time. The rewrite enable signal wback is generated based on the write enable signal wenz and read enable signal renz which are supplied from the command receiving circuit 11 and the refresh signal refz supplied from there fresh signal generating circuit 2. Specifically, the write data buffer control circuit 5 has a logical circuit which takes the logic of the write enable signal wenz, read enable signal renz and refresh signal refz and outputs the rewrite enable signal wback. Such a logical circuit can be structured variously and the specific illustration thereof is, therefore, omitted.

Figure 7:
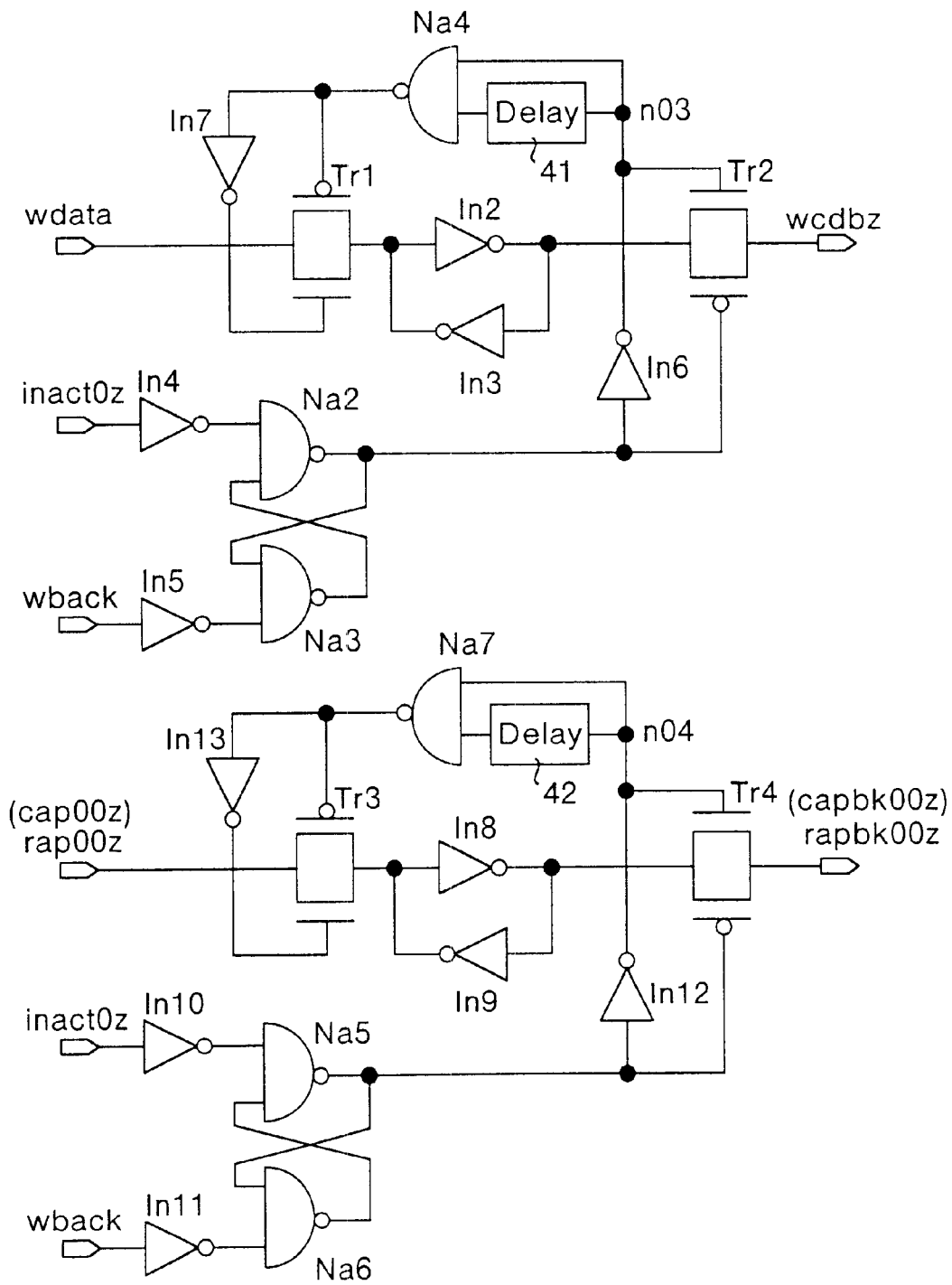
FIG. 7 is a circuit diagram showing an example of the structure of a write data buffer in a semiconductor memory according to the first embodiment of the present invention.

FIG. 7 is a circuit diagram showing one example of the structure of a part of the write data buffer 4. The write data buffer 4 is provided with a circuit which holds write data and a circuit which holds a set of row address and column address corresponding to the held data. For example, one combination of a circuit which holds write data and a circuit which holds a set of row address and column address corresponding to the held data is disposed in each block column. The circuit which holds write data is structured of, for example, two transfer gates Tr1 and Tr2, six inverters In2 to In7, three NAND gates Na2 to Na4 and a delay circuit 41. The write data wdata supplied from the data input-output circuit 15 is input into a latch consisting of two inverters In2 and In3 through the first transfer gate Tr1. The data of the latch is output as a rewrite data wcdbz to the data buses through the second transfer gate Tr2.

A non-activating signal inact0z is inverted by the inverter In4 and input into the NAND gate Na2 among the two NAND gates Na2 and Na3 constituting a flip-flop circuit. The rewrite enable signal wback is inverted by the inverter In5 and input into the other NAND gate Na3. The outputs of these two NAND gates Na2 and Na3 are another inputs of the other NAND gates Na3 and Na2, respectively. The second transfer gate Tr2 is controlled by the output signal of the NAND gate Na2 and a signal formed by inverting the output signal by the inverter In6.

The output signal of the inverter In6 is input directly to one input terminal of the NAND gate Na4. The output signal of the inverter In6 is input into another input terminal of the NAND gate Na4 through the delay circuit 41. This delay circuit 41 is disposed to enable the acceptance of the next data after the data held in the latch is exactly transferred to the write amplifier or the data buses. The first transfer gate Tr1 is controlled by the output signal of the NAND gate Na4 and a signal formed by inverting the output signal by the inverter In7.

A circuit which holds a set of row addresses is a circuit having the same structure as the aforementioned circuit which holds write data except that the names of each part are changed as follows: the transfer gates Tr1 and Tr2 to transfer gates Tr3 and Tr4, the six inverters In2 to In7 to inverters In8 to In 13, the three NAND gates Na2 to Na4 to NAND gates Na5 to Na7 and the delay circuit 41 to a delay circuit 42. In place of the write data wdata, a decode signal rap00z of one of the row addresses corresponding to the held data is input into the input side transfer gate Tr3 from the row decoder 13. From the output side transfer gate Tr4, a decode address signal rapbk00z for rewrite in place of the rewrite data wcdbz is supplied to the main word drivers and sense amplifier drive circuit 83.

A circuit which holds a set of column addresses, though not shown, is a circuit having the same structure as the aforementioned circuit which holds a row address. However, in place of the decode signal rap00z of a row address, a decode signal cap00z of one of the column addresses is input into an input side transfer gate from the column decoder 14. Also, from an output side transfer gate, a column direction decode address signal capbk00z for rewrite in place of the row direction decode address signal rapbk00z is supplied to the column driver 81. In this manner, when data is held in the write data buffer 4, the decoded addresses (row address and column address) are held together. Therefore, the write data buffer 4 is provided with an area storing the held data and an area storing the decoded addresses.

When the held data is rewritten in a corresponding memory cell, a word line and a column line are activated based on the address stored in the write data buffer 4. In the example shown in FIG. 7, since the decoded addresses rap00z and cap00z are stored in the write data buffer 4, the row decode address signal rapbk00z for rewrite and the column decode address signal capbk00z for rewrite are input directly to the main word drivers and the sense amplifier drive circuit 83 and the column driver 81, respectively. The write data buffer 4 is provided with circuits having the aforementioned structure in numbers same as those of the predetermined addresses and the addresses are, thereby, held. The write data buffer 4 may be made to store an address itself which has not been decoded. In this case, addresses for rewrite which are output from the write data buffer 4 are input into the row decoder 13 and the column decoder 14.

Figure 8:
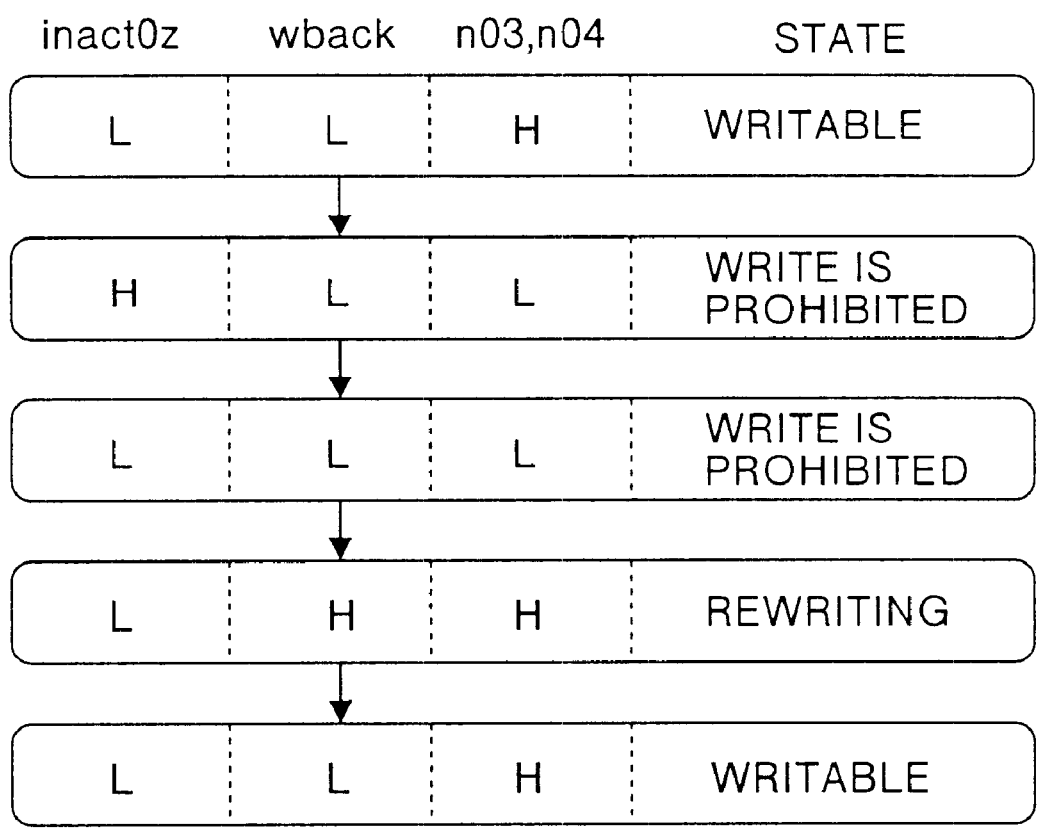
FIG. 8 is a logical value table showing a logical relationship between each signal as to the circuit shown FIG. 7.

FIG. 8 is a logical value table showing the logical relationship between each signal as to the circuit shown in FIG. 7. In FIG. 8, n03 and n04 represent, for convenience of explanation, nodes. The node n03 corresponds to an output terminal point of the inverter In6 and the node n04 corresponds to an output terminal point of the inverter In12. First, a latch of write data will be explained. In the initial state, the non-activating signal inact0z and the rewrite enable signal wback are both "L" and the potential level of the node n03 is "H". At this time, the state allows the rewrite of data.

When the non-activating signal inact0z is "H" and the rewrite enable signal wback is "L", the potential level of the node n03 is "L". This allows the input side transfer gate Tr1 to be put in an OFF state and the output side transfer gate Tr2 to be put in an OFF state. Therefore, the write data buffer 4 is in a write inhibitive state, thereby the write data wdata input is latched. The non-activating signal inact0z is then changed to "L", but the write inhibitive state continues. Here, the non-activating signal inact0z is changed to "H" in response to the condition that a corresponding non-activating signal inact#z (for example, #=5) in each block column is activated to "H".

When the non-activating signal inact0z is changed to "L" and the rewrite enable signal wback is changed to "H" from this condition, the potential level of the node n03 is changed to "H". This results in that the output side transfer gate Tr2 is put in an ON state and the data held in the latch is output to the data buses as the rewrite data wcdbz and written in a corresponding memory cell by the write amplifier. The memory cell in which the data is written is specified by the addresses held in the aforementioned circuit which holds a row address and in the aforementioned circuit which holds a column address in the write data buffer 4. Thereafter, the system returns to the initial state.

This is the same for the latch of the row address and column address. Specifically, when the non-activating signal inact0z is "H" and the rewrite enable signal wback is "L", the row address and the column address are latched. These latched row address and column address are output when the non-activating signal inact0z is "L" and the rewrite enable signal wback is "H".

Figure 9:
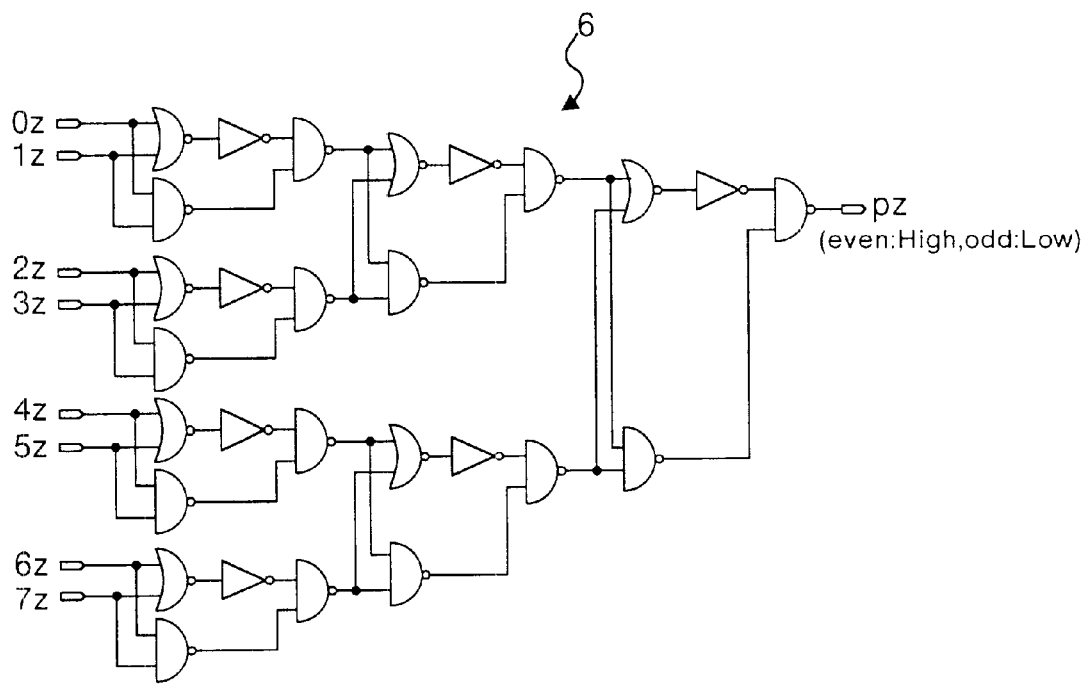
FIG. 9 is a circuit diagram showing an example of the structure of a parity generating circuit in a semiconductor memory according to the first embodiment of the present invention.

FIG. 9 is a circuit diagram showing one example of the structure of the parity generating circuit 6. This parity generating circuit 6 is, though not particularly limited to, a circuit which generates a parity as, for example, data of 8 bits. In FIG. 9, 0z to 7z are data of each bit of 8-bit data supplied from the data input-output circuit 15. This parity generating circuit 6 is a logical circuit in which each 8 bit-data 0z to 7z is input and a parity signal pz is "H" when the last significant bit of the sum of each data is an even number whereas the parity signal pz is "L" when the last significant bit of the sum of each data is an odd number. The parity signal pz is transferred to the write amplifier and written in a corresponding parity bit of the memory cell array 8.

Figure 10:
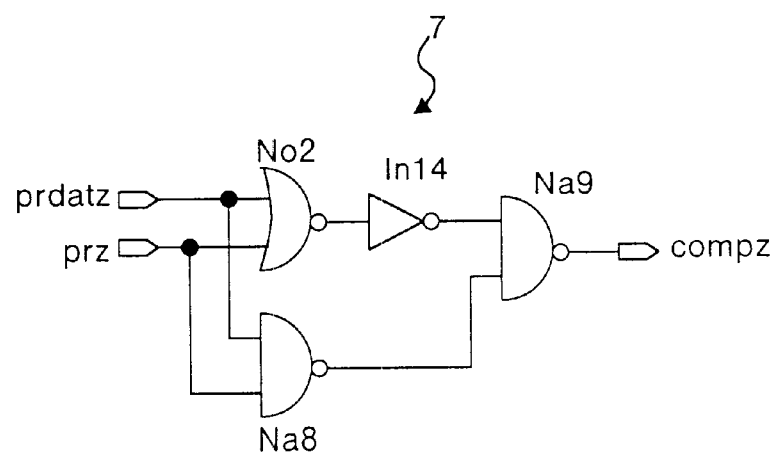
FIG. 10 is a circuit diagram showing an example of the structure of a parity-data comparing circuit in a semiconductor memory according to the first embodiment of the present invention.

FIG. 10 is a circuit diagram showing the structure of the parity-data comparing circuit 7. In FIG. 10, prdatz is a parity generated based on the data read from the memory cell array 8, namely, the parity of the read data. This parity prdatz of the read data is, for example, calculated on the assumption that when the refresh operation is overlapped on the usual data read operation, data of a memory cell which cannot be read because the refresh operation is given priority is 1 though no particular limitation is imposed on the method of calculating the parity. prz is the parity stored in the memory cell array 8, specifically, the parity (hereinafter referred to as accumulated parity) accumulated together when data which is a subject of the read is written in the memory cell array 8.

The parity-data comparing circuit 7 is provided with a NOR gate No2 and a NAND gate Na8 which, respectively, take NOR logic and NAND logic of the parity prdatz of the read data and the accumulated parity prz, an inverter In14 which inverts the output of the NOR circuit No2 and a NAND gate Na9 which takes NAND logic of the output of the inverter In14 and the output of the NAND gate Na8. The output signal of the NAND gate Na9, namely the output signal compz of the parity-data comparing circuit 7 is 1 if the parity prdatz of the read data coincides with the accumulated parity prz and 0 if the both parities prdatz and prz don't coincide with each other. Here, since the data of the memory cell which cannot be read is assumed as 1, the value of the output signal compz is output as it is to the data input-output circuit 15 as the data of the memory cell from which the data cannot be read.

Figure 11:
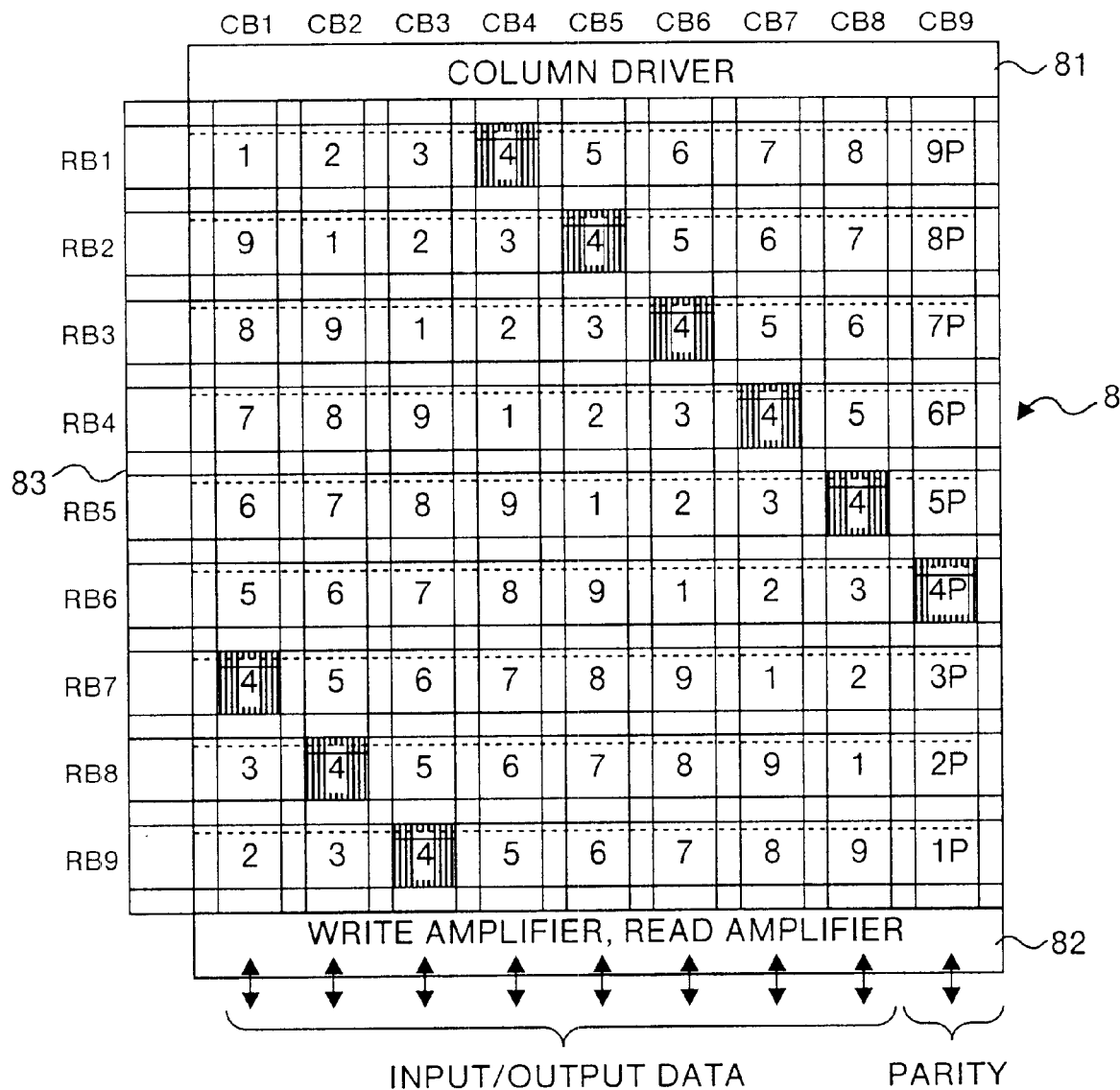
FIG. 11 is a diagram explaining the case of performing a usual data read operation or data write operation independently in a semiconductor memory according to the first embodiment of the present invention.

Next, in the semiconductor memory 1 according to the first embodiment, explanations will be furnished about a case in which the usual data read operation or data write operation is performed, specifically, the data read operation or the data write operation is independently performed without overlap on the refresh operation taking FIG. 11 as an example. In the example shown in FIG. 11, the block 4 is assumed to be the subject of the data read and the data write. Therefore, nine sub-arrays RB1*CB4, RB2*CB5, RB3*CB6, RB4*CB7, RB5*CB8, RB6*CB9, RB7*CB1, RB8*CB2 and RB9*CB3 belonging to the block 4 are activated. Accordingly, nine main word lines rise. Because one column selective line rises in the block column of each of CB1 to CB9, nine column selective lines in total rise. A predetermined number of data buses is disposed in each column selective line and the predetermined number of data are read or written.

Figure 12:
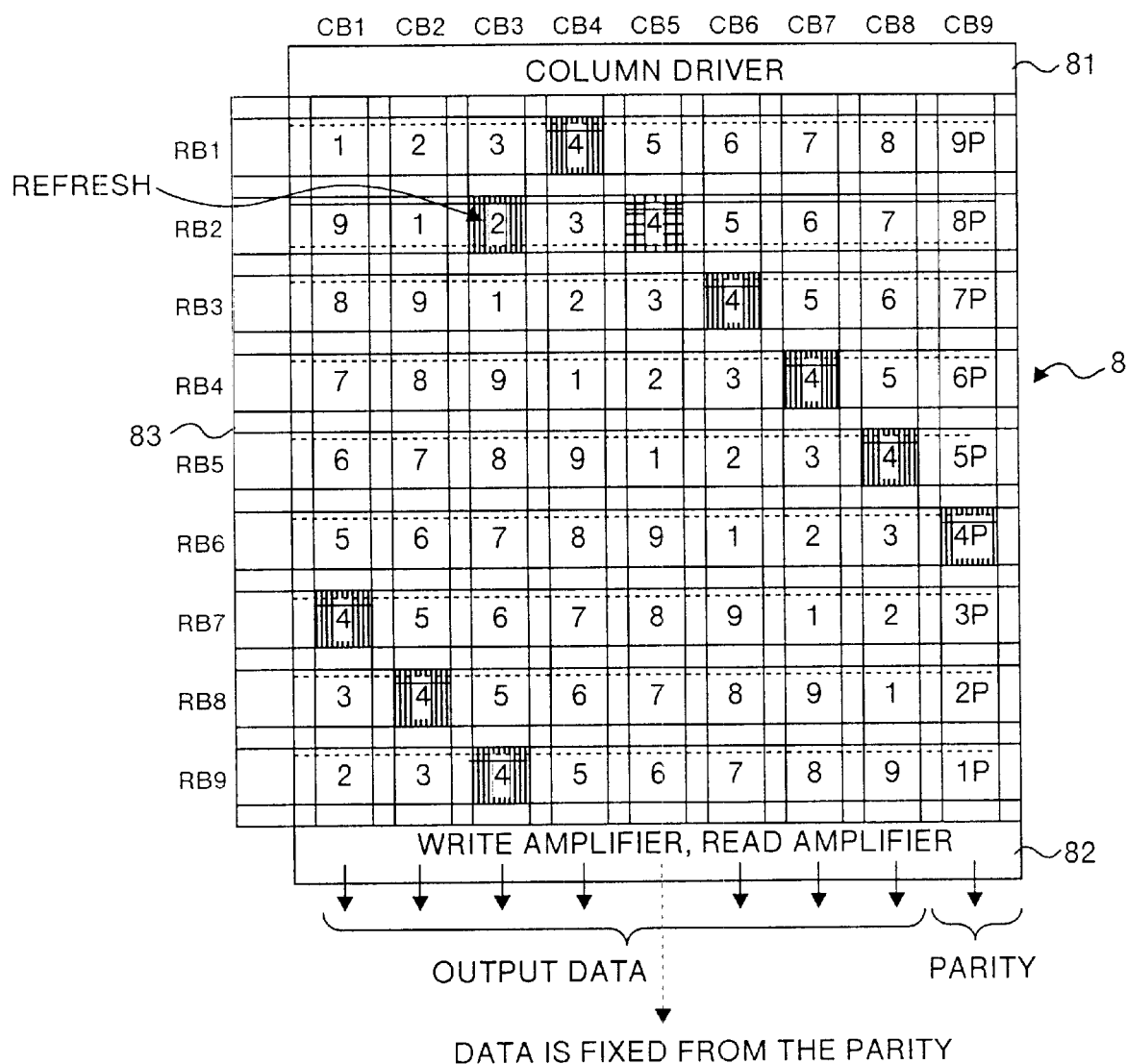
FIG. 12 is a diagram explaining a case in which a refresh operation and a data read operation are performed at the same time in a semiconductor memory according to the first embodiment of the present invention.

Next, explanations will be given about a case in which the refresh operation and the data read operation are performed at the same time in the semiconductor memory 1 according to the first embodiment taking FIG. 12 as an example. In the example shown in FIG. 12, the block 4 is a subject of the data read and the sub-array of RB2*CB3 is a subject of the refresh similarly to the example shown in FIG. 11. In this case, because the refresh operation is given priority in the block row RB2, the sub-array RB2*CB3 is activated and a word line corresponding to the refresh address is activated.

On the contrary, the sub-array of RB2*CB5 belonging to the block 4 is not activated. For this reason, the data stored in a memory cell in the sub-array of RB2*CB5 is not output resultantly. However, as aforementioned, the data which is not output is assumed as 1 to compare the parity prdatz of read data with the accumulated parity prz by the parity-data comparing circuit 7, thereby, determining the value of the data which is not output. Also, in the block column CB3, the sub-array of RB2*CB3 which is a subject of the refresh and the sub-array of RB9*CB3 which is a subject of the read are activated and the sub-array of RB9 * CB3 is selected by the sub-array selective signal selz whereby no data is output from the sub-array which is a subject of the refresh and data is output only from the sub-array which is a subject of the read.

Figure 13:
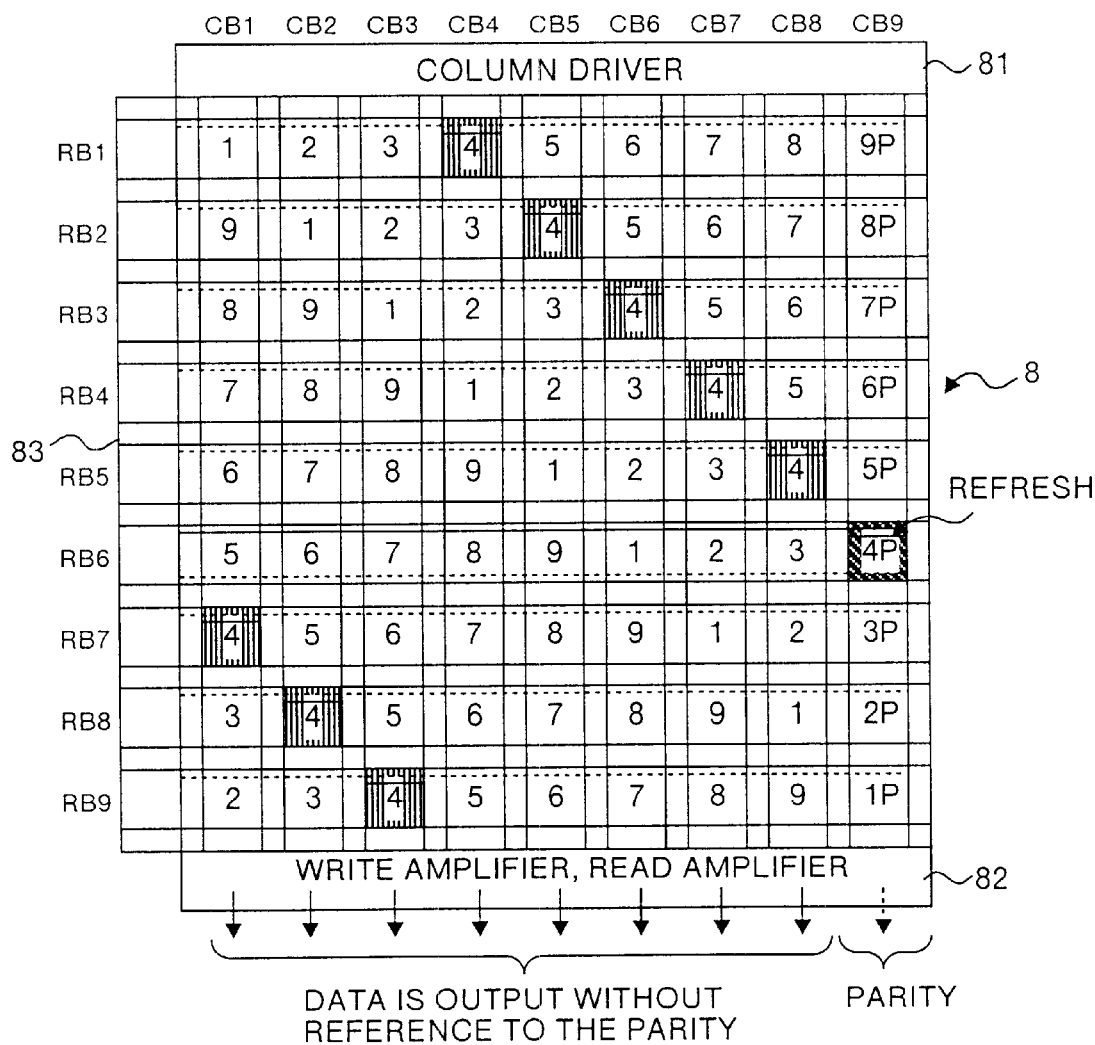
FIG. 13 is a diagram explaining a case in which a refresh operation and a data read operation are performed at the same time in a semiconductor memory according to the first embodiment of the present invention.

FIG. 13 shows a case in which a parity storing sub-array is a subject of the refresh when the refresh operation and the data read operation are performed at the same time. Specifically, in FIG. 13, the sub-array of RB6*CB9 is a parity storing sub-array of the block 4 and, at the same time, a subject of the refresh. In this case, because the refresh operation is given priority, the accumulated parity prz is not output from the sub-array of RB6 CB9, but all data except for a parity are output from the block 4. The output data is read data as it is.

Figure 14:
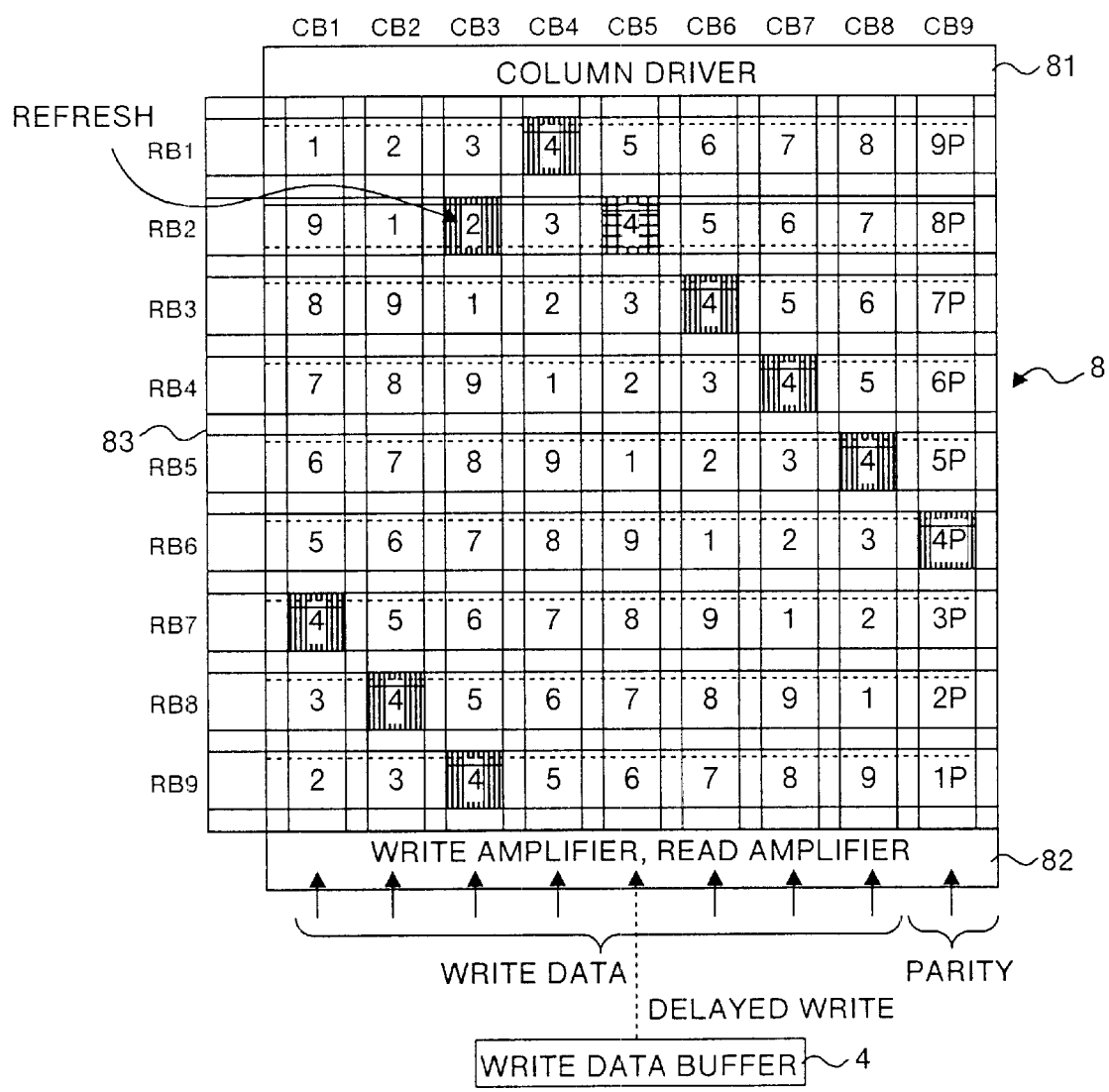
FIG. 14 is a diagram explaining a case in which a refresh operation and a data write operation are performed at the same time in a semiconductor memory according to the first embodiment of the present invention.

Next, explanations will be given about a case in which the refresh operation and the data read operation are performed at the same time in the semiconductor memory 1 according to the first embodiment taking FIG. 14 as an example. In the example shown in FIG. 14, the block 4 is a subject of the data write and the sub-array of RB2*CB3 is a subject of the refresh similarly to the example shown in FIG. 11. Similarly to the case of read, the refresh operation is given priority in the block row RB2 and, therefore, the sub-array of RB2*CB3 is activated. Because the sub-array of RB2*CB5 is not activated, no data can be written in a memory cell in the sub-array of RB2*CB5.

The data to be written in the memory cell in the sub-array of RB2 * CB5 is written once in the write data buffer 4. Then, as aforementioned, the data held in the write data buffer 4 is written in the proper memory cell when any one of the refresh operation, the data write operation and the data read operation is independently performed. This is the same to a case in which the parity storing sub-array is a subject of the refresh when the refresh operation and the data write operation are performed at the same time.

According to the first embodiment, when the refresh operation and the data read or data write operation are performed at the same time, the data in a memory cell which cannot be read because the refresh operation is given priority is determined based on the parity. Furthermore, the data in a memory cell in which the data cannot be written because the refresh operation is given priority is rewritten in the proper memory cell after being stored and held temporarily in the write data buffer 4. This arrangement makes it possible to free the semiconductor memory from the refresh operation apparently. Therefore, the problem that a difference in the speed of the read operation and in the speed of the write operation caused by the hit or miss of the cache when a cache memory is used to free a semiconductor memory from the refresh operation and the problem that the semiconductor memory is large-scaled or the degree of integration is decreased by disposing a large cache memory to lower the rate of cache miss can be solved.

Also, the first embodiment has the structure in which a refresh signal is generated in the semiconductor memory 1 and the refresh operation is performed based on the refresh signal. It is unnecessary to input a refresh command from the outside. Because the semiconductor memory 1 can be used as a storage of an SRAM interface, a conventional SRAM can be replaced by the semiconductor memory 1. In this case, a consequence is that the power consumption and the area of the integrated circuit are smaller than those in the case of the SRAM.

Also, according to the first embodiment, the semiconductor memory 1 may be used as a storage which is the same as or similar to a DRAM interface and for which a refresh command from the outside is not required. In this case, because no refresh command is required, such an effect that the timing control of a refresh operation and a data read operation or a data write operation is made simple. Also, because there is no time zone during which memory access is inhibited on account of a refresh operation, the utilization efficiency of a bus can be more improved than in the case of a conventional DRAM without burdening a memory controller with a complex operation. To state in other words, a high data transfer speed is attained.

According to the first embodiment, the peak current consumption during a refresh operation is more decreased than in the conventional case of performing refresh in the unit of block because the refresh operation is performed in the unit of sub-array. Therefore, the noise of power wirings caused by a variation in current consumption can be decreased. Also, because the maximum value of the supply capacity of a power generating circuit can be decreased depending on an architecture, such an advantage that the circuit area can be more decreased and the designing can be made more easily is obtained.

It is to be noted that, in the first embodiment, explanation is given for a case where the number of the blocks defined by a row address is eight, as an example. However, the invention is not limited to this case and the number of the blocks may be seven or less or nine or more. Also, in the first embodiment, the data which is a subject of read or write is designed to be 8 bits; however, the invention is not limited to this and the same effect is obtained even if the data is 4 bits, 16 bits, 32 bits or 64 bits. Moreover, all of the structure of the memory cell array 8, the hierarchical structure of the word line, the structure as to the connection between the sense amplifiers and the data buses, the refresh signal generating circuit 2, the write data buffer 4, the write data buffer control circuit 5, the parity generating circuit 6 and the parity-data comparing circuit 7 are not limited to the aforementioned structures and can be variously changed in design.

Figure 15:
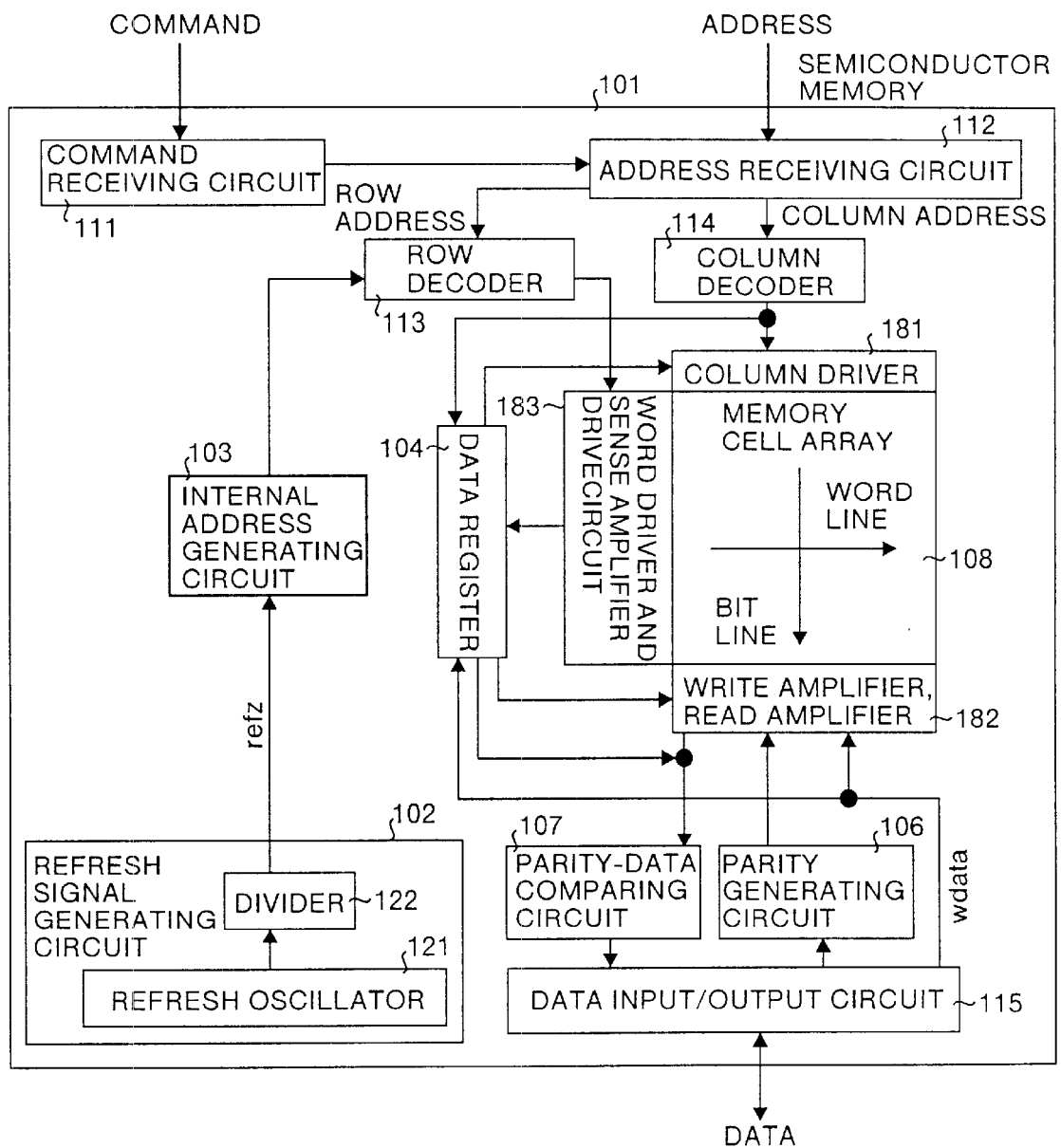
FIG. 15 is a block diagram showing the structure of a semiconductor memory according to a second embodiment of the present invention.

FIG. 15 is a block diagram showing the structure of a semiconductor memory according to a second embodiment of the present invention. This semiconductor memory 101 is provided with a command receiving circuit 111, an address receiving circuit 112, a row decoder 113, a column decoder 114, a data input and output circuit 115, a refresh signal generating circuit 102 and an internal address generating circuit 103 which corresponds to a refresh unit, a data register 104 which is a memory area comprising a nonvolatile storage, a parity generating circuit 106 which corresponds to a parity generating unit, a parity-data comparing circuit 107 which is a parity-data comparing unit, a memory cell array 108, a column driver 181, a data bus amplifier section 182 including a write amplifier and a read amplifier and a word driver and sense amplifier drive circuit 183.

Further, the refresh signal generating circuit 102 is constituted of a refresh oscillator 121 and a divider 122. Similarly to the first embodiment, the command receiving circuit 111 outputs a control signal for taking an address in the address receiving circuit 112 in time for commands for reading and writing data received from, for example, an external CPU. The taken address is decoded by the row decoder 113 and the column decoder 114 and supplied to the word driver and sense amplifier drive circuit 183 and the column driver 181. The aforementioned parity generating circuit 106 and the aforementioned parity-data comparing circuit 107 have the same structures as the parity generating circuit 106 and the parity-data comparing circuit 7 according to the first embodiment, respectively, therefore, explanations of these parts are omitted.

The semiconductor memory 101 according to the second embodiment 2 has the following structure. Specifically, a refresh signal is generated in the semiconductor memory 101 to perform a refresh operation on the basis of the refresh signal. Also, when data is written, a parity is generated and stored. When the refresh operation and a usual data read or data write operation are performed at the same time and a sub-array which is a subject of refresh and a sub-array including a memory cell which is a subject of read or write use a sense amplifier in common or as a signal line used in a read or write operation, one used in plural sense amplifier columns in common and one used in sense amplifier columns relative to the same block in common are used together, the sub-array which is the subject of refresh is given priority.

For this reason, data in a memory cell which cannot be read when data is read is assumed 1 (maybe 0) to generate a parity and the generated parity is compared with the value of a parity stored when the data is written to determine the value of the data assumed as 1 (or 0). Also, data which cannot be written in a memory cell because a sub-array which is a subject of the refresh is given priority is stored and held temporarily in a data register 104. Then the effective data is rewritten in a corresponding memory cell when the successive data read or write operation is performed in a row including a memory cell in which the data held in the data register 104 is to be originally written.

Figure 16:
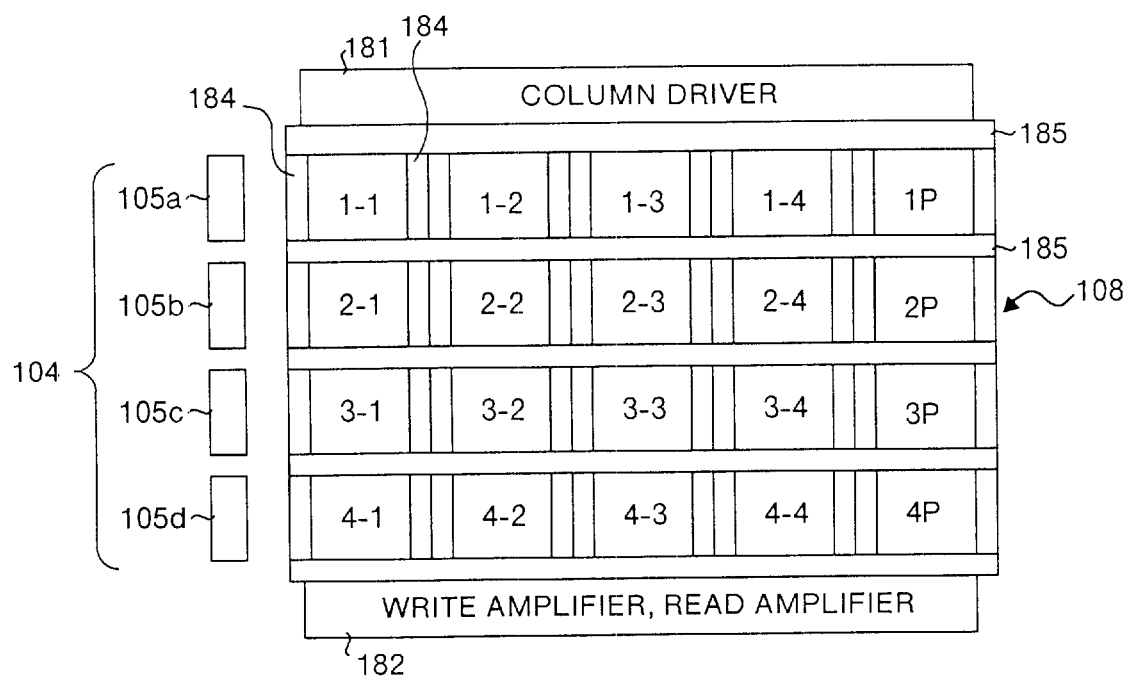
FIG. 16 is a diagram for explaining one example of the structure of a memory cell array in a semiconductor memory according to the second embodiment of the present invention.

FIG. 16 is a diagram for explaining one example of the structure of a memory cell array 108. The memory cell array 108 has, though not necessarily limited to, a structure in which, for example, 20 sub-arrays are arranged like a matrix of size 4 (row)×5 (column). Each sub-array has a structure in which plural memory cells are arranged matrix-like, though not particularly illustrated. For example, in the second embodiment, 5 sub-arrays constitutes one block and the memory cell array 108 is constituted of 4 blocks.

In the example shown in FIG. 16, the block 1 is constituted of 4 sub-arrays shown as "1-1" to "1-4" and one sub-array for parity shown as "1P" in the figure. Similarly, the block 2 is constituted of 4 sub-arrays shown as "2-1" to "2-4" and one sub-array for parity shown as "2P" in the figure. This is the same to the block 3 and the block 4. sub-arrays contained in the same block is arranged in the same block row. Namely, sub-arrays in one row which are lined along a word line with the same row address are included in the same block.

Each sub-array is surrounded by a word driver 184 and a sense amplifier column 185. The word driver 184 is structured such that it can operate independently on each sub-array. For example, in the second embodiment, the number of sense amplifiers (paired bit line) which are disposed is 2k (provided that k 1024) per one block and the ratio of the word driver 184 disposed is one for every 512 sense amplifiers. For example, 512 or 1024 word lines are arranged in a zones and sandwiched between the sense amplifier columns 185, specifically, in one block row.

In addition, data registers 105a to 105d (in FIG. 15, the symbol 104 representing these registers is attached) are disposed every row address and have the same row address as the memory cell array 108. Whether data held in each of these data registers 105a to 105d is effective or not is determined by a flag. Specifically, the flag has a function as a means determining whether data held in the data registers 105a to 105d is effective or ineffective. For example, if the held data is effective, the flag is 1 where as if the held data is ineffective, the flag is 0. Also, in addition to the data, a column address (or may be a column address and a row address) of a memory cell in which the data is to be originally stored and the address of a sub-array are stored in each of the data registers 105a to 105d.

Figure 17:
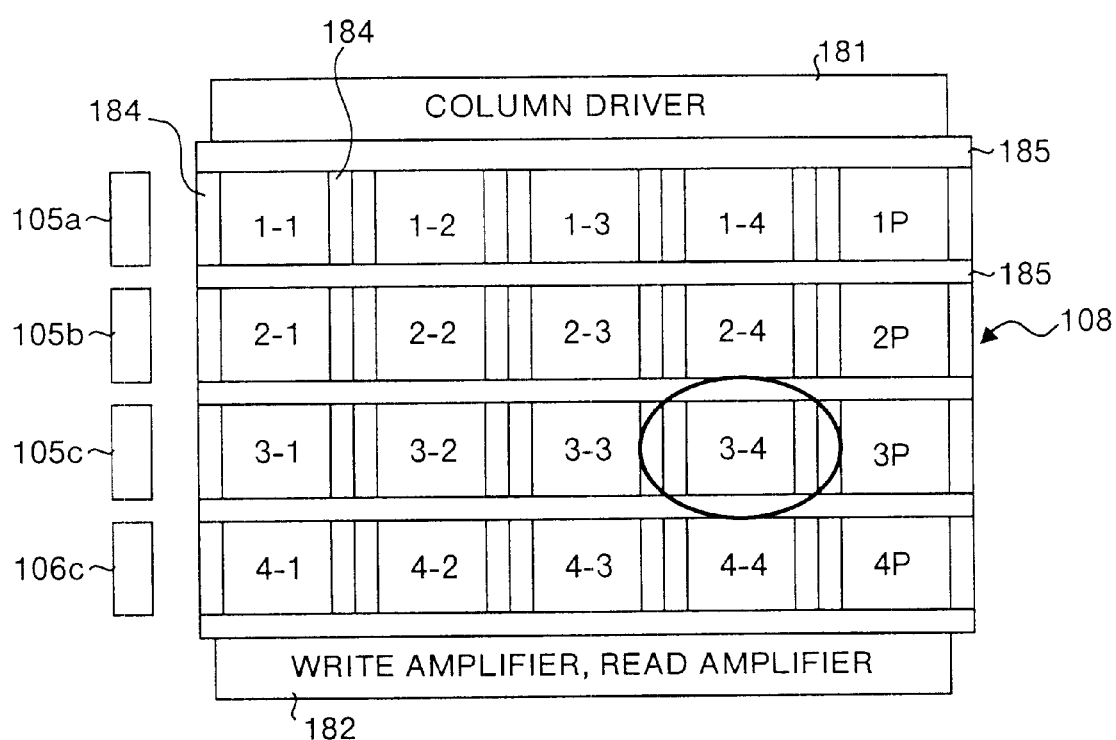
FIG. 17 is a diagram for explaining a refresh unit in a semiconductor memory according to the second embodiment of the present invention.

FIG. 17 is a diagram for explaining a refresh unit in the second embodiment. As shown in FIG. 17, the refresh operation is performed in the unit of sub-array. FIG. 17 shows a case in which a sub-array positioned at the fourth place of the block 3, namely the sub-array of 3-4 is a subject of the refresh. In the structure shown in FIG. 17, five sub-arrays per one block is provided and therefore a refresh operation is accomplished at an interval of ⅕ of that in the conventional case where the refresh operation is performed in the unit of block. To state in other words, an oscillation signal generated in a refresh oscillator 121 is divided by a divider 122 so that the frequency is 5 times higher than that of a conventional signal used for controlling refresh timing.

Based on a refresh signal refz output from the refresh signal generating circuit 102, row addresses for activating a sub-array which is a subject of the refresh are generated successively by the internal address generating circuit 103 and the refresh operation is performed based on the generated row address in the same manner as in the first embodiment.

Figure 18:
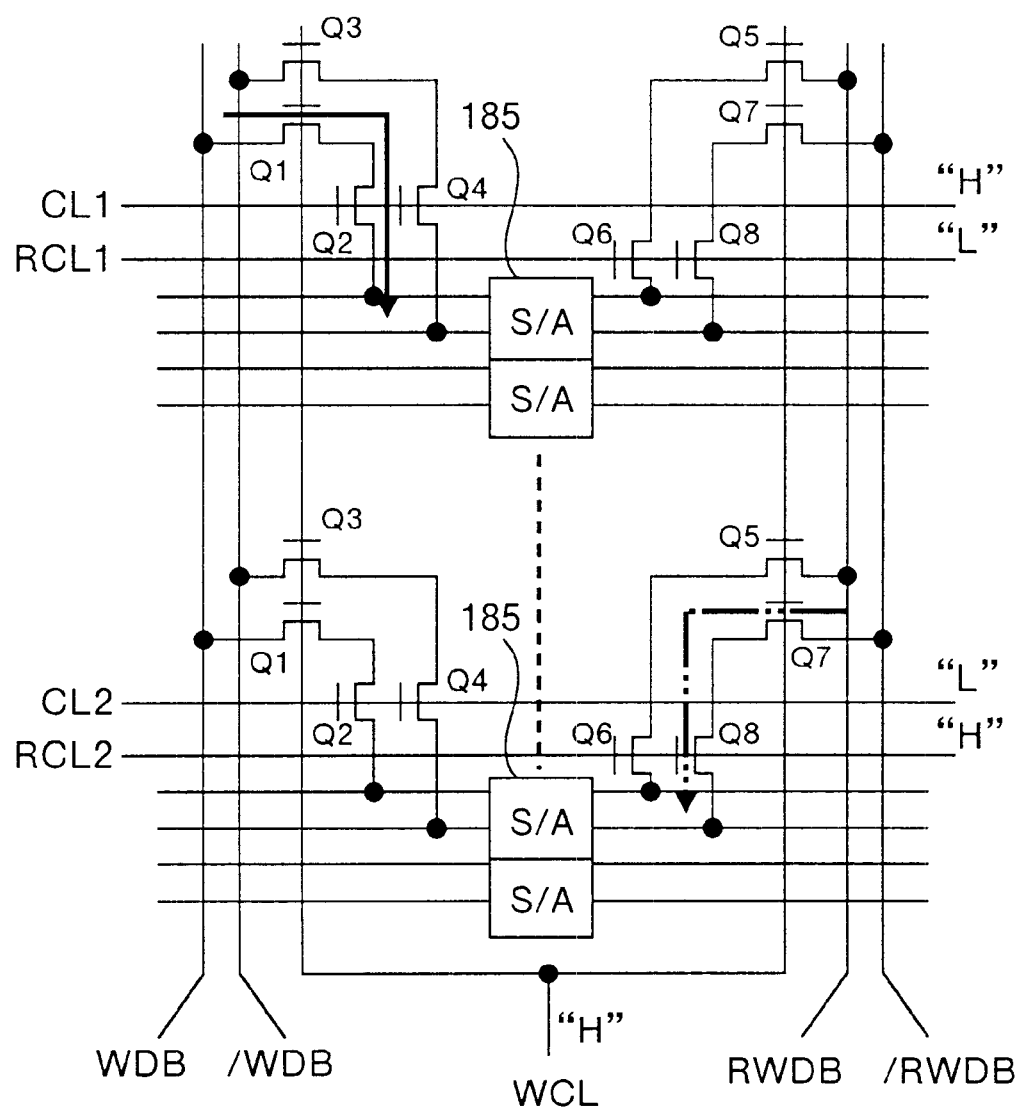
FIG. 18 is a circuit diagram showing an essential part of the electric connection between sense amplifiers and data buses in a semiconductor memory according to the second embodiment of the present invention.

FIG. 18 is a circuit diagram showing the essential part of the relation of the connection between the sense amplifiers and the data buses. In FIG. 18, WDB and/WDB are a pair of data buses, CL is a column selective line used when the usual data write operation is performed, RWDB and/RWDB are a pair of data buses used when an operation of rewrite of the data from the data register 104 is performed and RCL is a column selective line used when the operation of rewrite of the data from the data register 104 is performed.

Namely, the semiconductor memory according to the second embodiment provided with the two data buses RWDB and/RWDB for data rewrite operation and the column selective line RCL besides the two data buses WDB and/WDB for usual data write operation and the column selective line CL. WCL in FIG. 18 is a selective line for selecting sense amplifiers corresponding to a sub-array which is a subject of data write or data rewrite. The potential level of this selective line WCL is made to be "H" which is common to the sense amplifier column of the sub-array which is a subject of data write and data rewrite.

Each sense amplifier 185 is connected to the data bus WDB for usual write through two switching transistors Q1 and Q2 and to the data bus/WDB for usual write through two switching transistors Q3 and Q4. Also, each sense amplifier 185 is connected to the data bus RWDB for rewrite through two switching transistors Q5 and Q6 and to the data bus/RWDB for rewrite through two switching transistors Q7 and Q8. Four transistors Q1, Q3, Q5 and Q7 are, respectively, put in the ON state when the potential level of the selective line WCL is "H".

Two transistors Q2 and Q4 are, respectively, put in the ON state when the potential level of the column selective line CL1 for usual data write operation is "H". Therefore, a data wdata is supplied to the sense amplifiers 185, selected since the potential level of the column selective line CL for usual data write operation is changed to "H" when the potential level of the selective line WCL is "H", from the data input-output circuit 115 through the two data buses WDB and/WDB for usual data write operation. The data is written in a corresponding memory cell. This state is shown in the upper half section of FIG. 18 and the flow of the data is shown by the solid one-side arrow.

On the other hand, two transistors Q6 and Q8 are, respectively, put in the ON state when the potential level of the column selective line RCL2 for data rewrite operation is "H". Therefore, data is supplied to the sense amplifiers 185, selected since the potential level of the column selective line RCL2 for data rewrite operation is changed to "H" when the potential level of the selective line WCL is "H", from the data register 104 through the two data buses RWDB and/RWDB for data rewrite operation. The data is rewritten in a corresponding memory cell. This state is shown in the lower half section of FIG. 18 and the flow of the data is shown by the one-side arrow of the two-dot long and two short dashes line. The column selective line RCL2 for data rewrite operation is placed in the "H" level on the basis of the column address held together with the data in the data register 104.

Such a structure as to the relation of the connection between the sense amplifiers 185 and the data bus ensures that an operation of writing data in a certain memory cell in response to a write command and an operation of rewriting the held data from the data register 104 in a memory cell having the same column address as the certain memory cell can be performed independently in the sense amplifier column selected when the potential level of the selective line WCL is "H". Accordingly, the two data buses RWDB and/RWDB for data rewrite operation, the column selective line RCL for data rewrite operation and the switching transistors Q6 and Q8 constitute a means for rewriting the data stored and held in the data register 104 in a corresponding memory cell.

Figure 19:
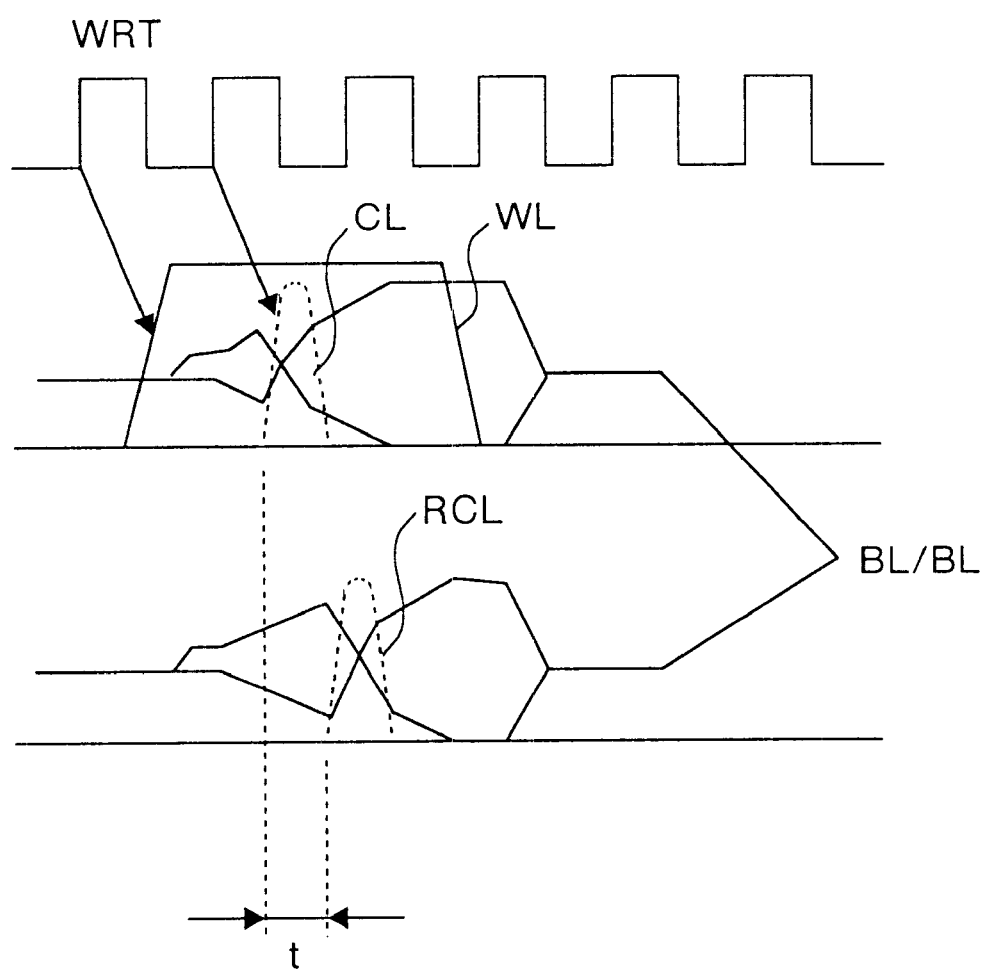
FIG. 19 is a schematic chart showing a waveform of each signal when data is written in a memory cell and data is rewritten in a memory cell having the same row address as the above memory cell from a data register shown in FIG. 18.

FIG. 19 is a waveform chart showing a waveform of each signal when data is written in a certain memory cell and data is rewritten in a memory cell having the same row address as the certain memory cell from the data register 104 in the circuit shown in FIG. 18. In FIG. 19, WRT represents a timing signal for write, WL represents the potential of a word line, CL represents the potential of the column selective line CL for usual data write operation, RCL represents the potential of the column selective line RCL for data rewrite operation and BL and/BL respectively represent the potential of bit lines. As shown in FIG. 19, the potential of the column selective line RCL for data rewrite operation is changed to the "H" level in timing delayed by t after the potential of the column selective line CL for usual data write operation is changed to the "H" level. It is to be noted that this figure explains a typical case and therefore does not reflect the actual duration of t.

The reason for this is that after the column selective line CL for usual data write operation corresponding to a certain memory cell rises when data is written, the flag of the data register 104 which corresponds to the same row address as that of the certain memory cell is examined and when the value is 1, specifically, effective data is held in the data register, the corresponding column selective line RCL for data rewrite operation rises.

Figure 20:
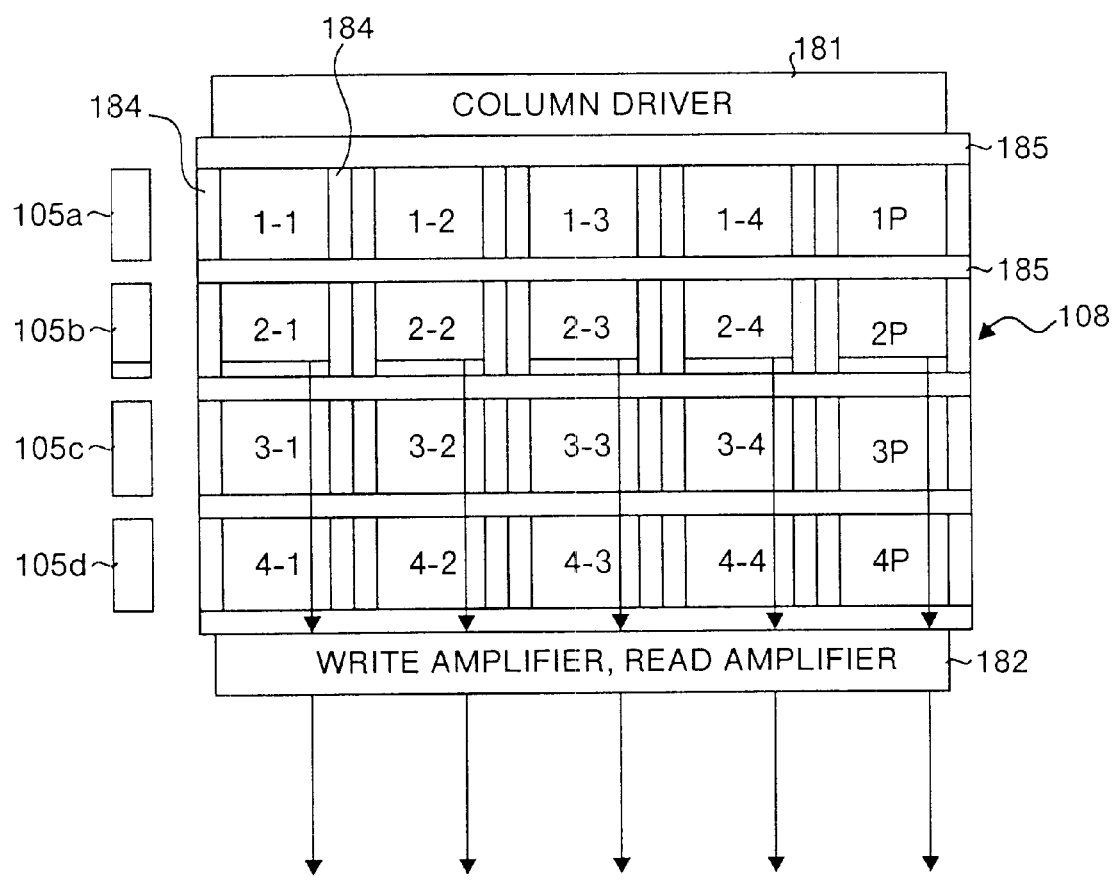
FIG. 20 is a diagram explaining the case (flag: 0) where a usual data read operation is independently performed in a semiconductor memory according to the second embodiment of the present invention.

Next, explanations will be given about a case in which the usual data read operation is independently performed, specifically, the usual data read operation is performed independently without overlapping on a refresh operation and the flag of the data register 104 is 0 in the semiconductor memory 101 according to the second embodiment with reference to FIG. 20. In the example shown in FIG. 20, the block 2 is a subject of the data read. For this reason, five sub-arrays 2-1,2-2,2-3, 2-4 and 2P belonging to the block 2 are activated. The data and the parity are output from a memory cell in each of these five sub-arrays.

Figure 21:
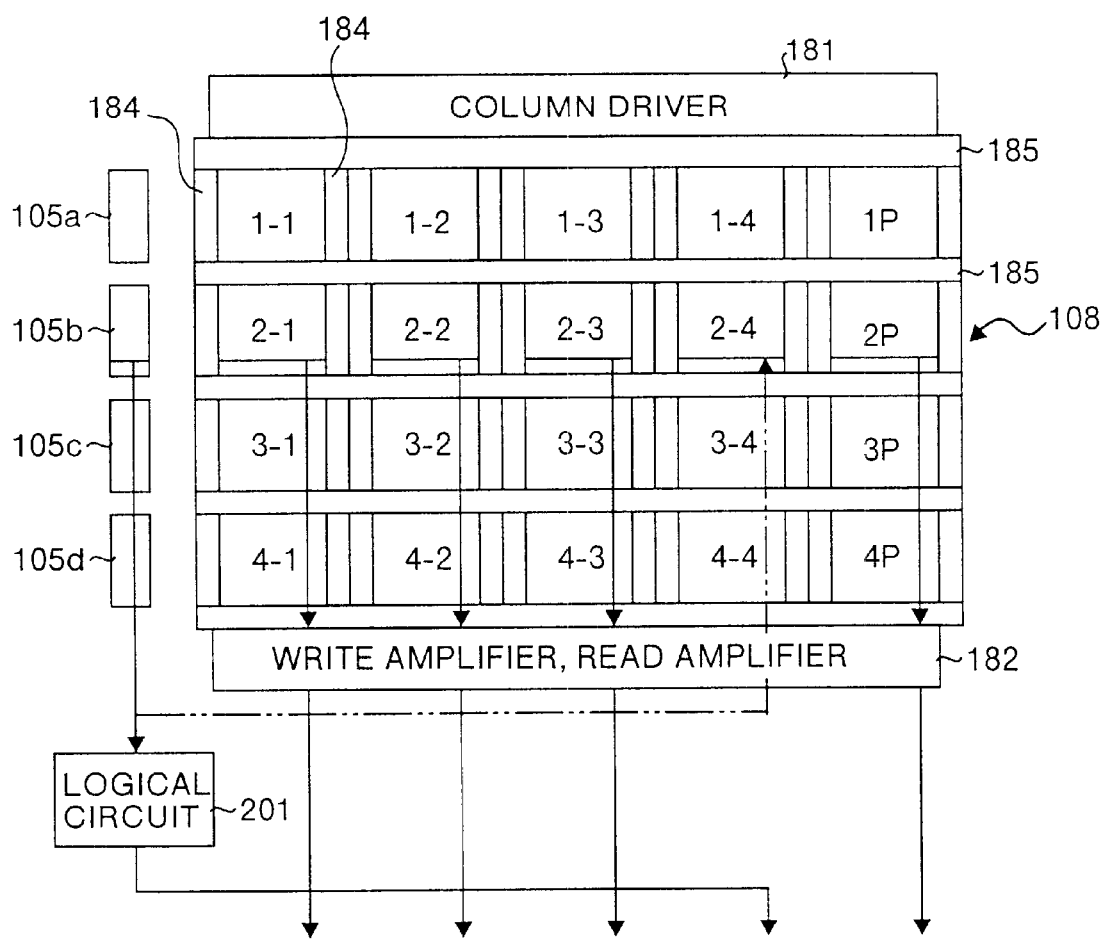
FIG. 21 is a diagram explaining the case (flag: 1) where a usual data read operation is independently performed in a semiconductor memory according to the second embodiment of the present invention.

Next, explanations will be given about a case in which the usual data read operation is performed and the flag of the data register 104 is 1 in the semiconductor memory 101 according to the second embodiment with reference to FIG. 21. In the example shown in FIG. 21, the block 2 is a subject of data the read. The column address held in the data register coincides with the column address which is a subject of the read and effective data which is to be written in a memory cell which is a subject of the read in the sub-array 2-4 is held in the data register 105b. In this case, with regard to each of the sub-arrays 2-1, 2-1, 2-3 and 2P, the data and the parity are output from a corresponding memory cell, but no correct data is output from the sub-array 2-4.

On the other hand, correct data is output from the data register 105b through a logical circuit 201. This logical circuit 201 will be explained later. Then, the data held in the data register 105b is rewritten in a corresponding memory cell of the sub-array 2-4. The data held in the data register 105b is invalid resulting from the completion of rewrite of the held data and therefore a corresponding flag of the data register 105b becomes 0. When the column addresses do not coincide with each other, the same usual read operation as in FIG. 20 is carried out and the data in the data register is rewritten.

Figure 22:
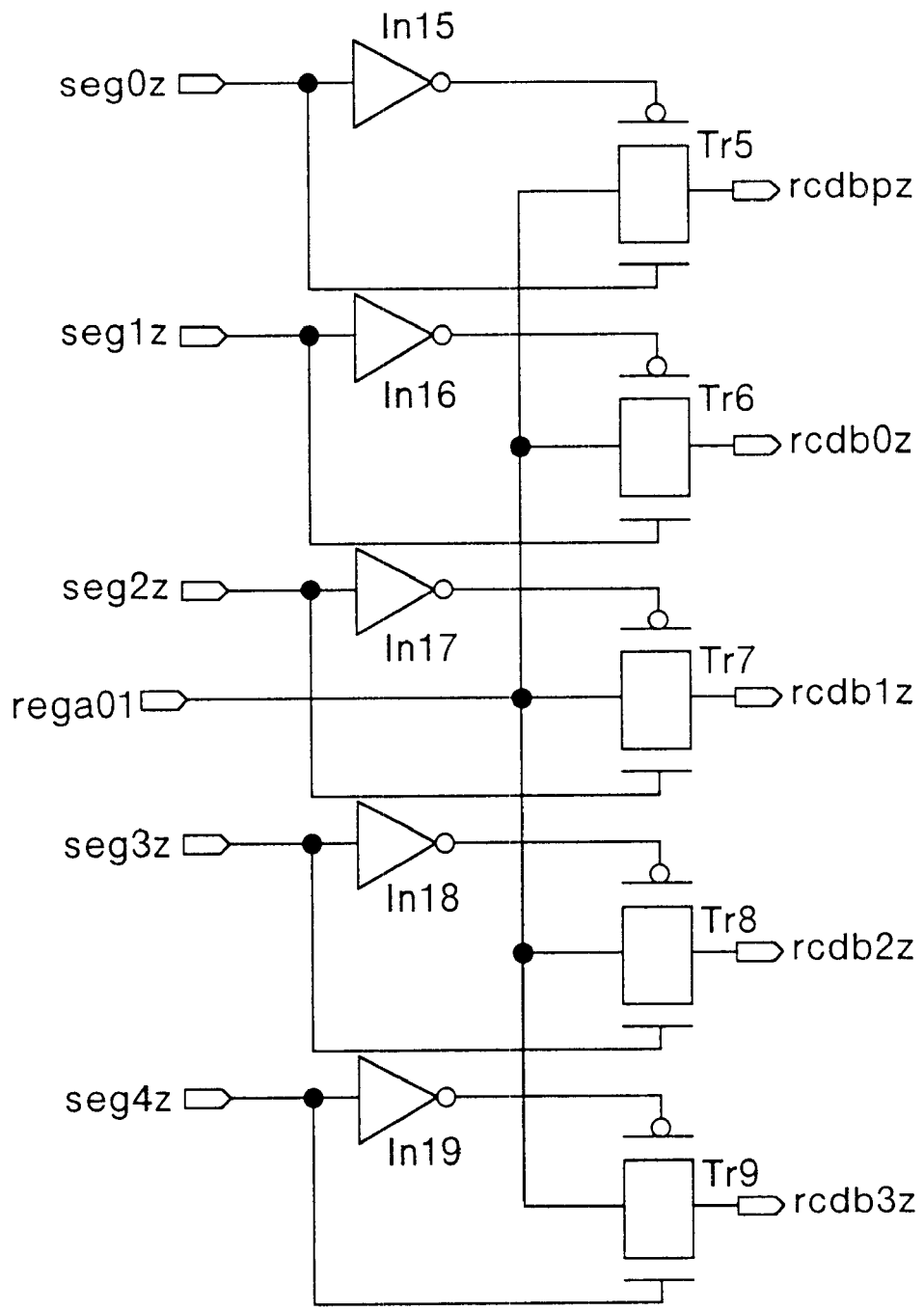
FIG. 22 is a circuit diagram showing one example of the structure of a logical circuit for supplying the data from a data register to data buses in a semiconductor memory according to the second embodiment of the present invention.

FIG. 22 is a circuit diagram showing one example of the structure of the logical circuit 201. This logical circuit 201 comprises transfer gates and inverters in numbers respectively equal to the number of sub-arrays per one block, specifically, five transfer gates Tr5 to Tr9 and five inverters In15 to In19 in the example illustrated. In FIG. 22, seg0z to seg4z are segment numbers of the data in the direction of the column of the sub-array which data is held in the data register corresponding to each address and rega01 is data held in the data register corresponding to a row address of a01. Here, in the segment numbers seg0z to seg4z in the direction of the column of the sub-array, j in seqjz (provided that j=0 to 4) is a numeral j when the number of the sub-array is expressed by i-j.

Also, rcdbpz is a read common data bus corresponding to the sub-array with a parity and rcdb0z to rcdb3z are read common data buses corresponding to four sub-arrays excluding the sub-array with a parity in one block. These read common data buses rcdbpz and rcdb0z to rcdb3z are used in common with the data buses for usual read data. The potential level of each of seg0z to seg4z is "H" when it is selected and "L" when it is unselected.

The transfer gate Tr5 is controlled by the signal seg0z and a signal obtained by inverting the signal seg0z by the inverter In15 and is put in the ON state when the potential level of seg0z is "H". The transfer gate Tr6 is controlled by the signal seg1z and a signal obtained by inverting the signal seg1z by the inverter In16 and is put in the ON state when the potential level of seg1z is "H". Similarly, the transfer gate Tr7, the transfer gate Tr8 and the transfer gate Tr9 are put in the ON state when the potential of each of seg2z, seg3z and seg4z is "H", respectively. By putting either one of these transfer gates Tr5 to Tr9 in the ON state, the data rega01 held in the data register is output to desired read common data buses rcdbpz and rcdb0z to rcdb3z.

Figure 23:
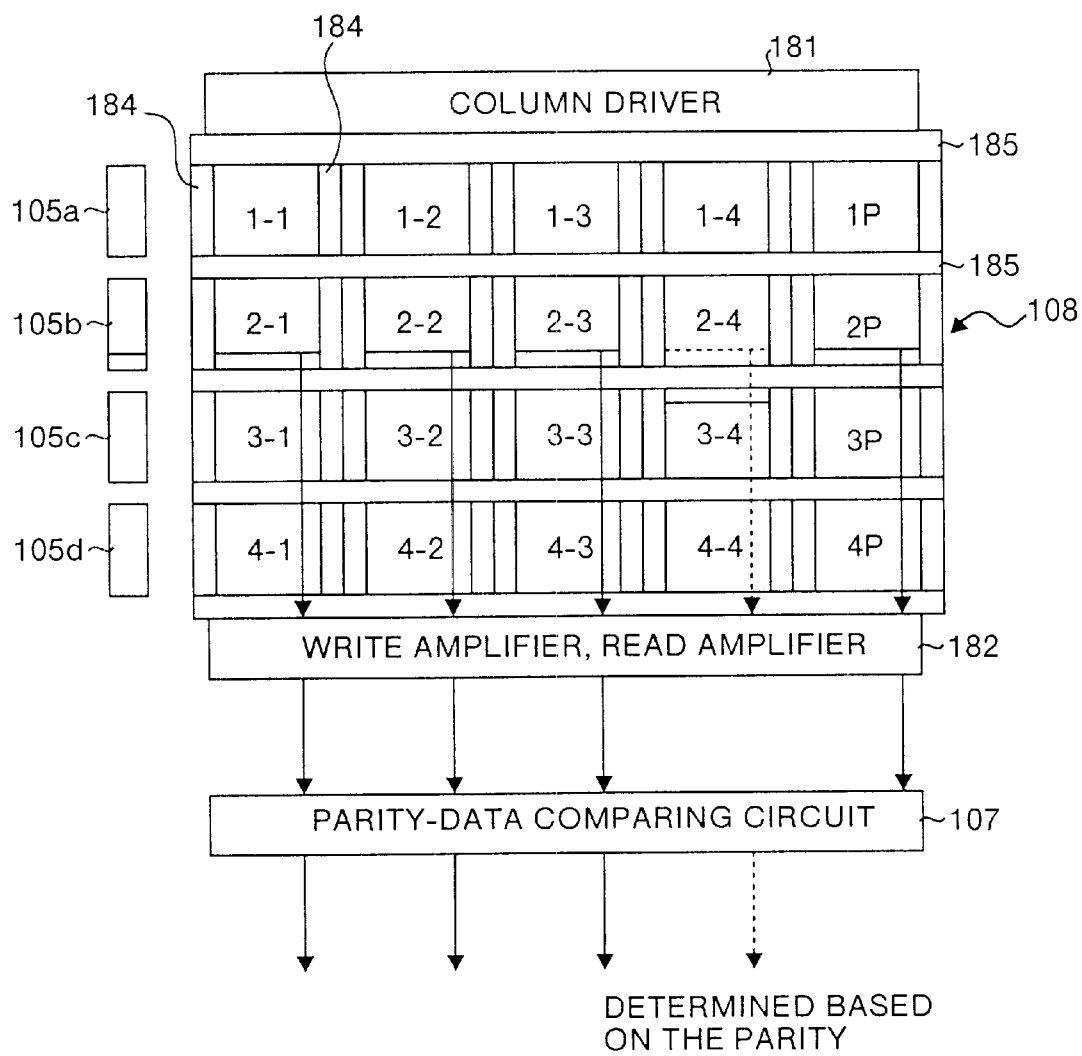
FIG. 23 is a diagram explaining the case (flag: 0) where a refresh operation and a data read operation are performed at the same time in a semiconductor memory according to the second embodiment of the present invention.

Next, explanations will be given about a case in which the refresh operation and the usual data read operation are performed at the same time and the flag of the data register 104 is 0 in the semiconductor memory 101 according to the second embodiment with reference to FIG. 23. In the example shown in FIG. 23, the block 2 is a subject of the data read similarly to the case of FIG. 20 and the sub-array of 3-4 is a subject of the refresh. In this case, since the refresh operation is given priority, a word line corresponding to the sub-array of 3-4 is activated, but a word line for the sub-array of 2-4 is not activated. Therefore, the data stored in a memory cell in the sub-array 2-4 is not output.

Therefore, in the same manner as in the first embodiment, the data of the sub-array of 2-4 is assumed as 1 to generate a parity on the basis of the above data and the data read from three sub-arrays 2-1, 2-2 and 2-3. Then, the generated parity is compared with the parity read from the sub-array of 2P in the parity-data comparing circuit 107 to thereby determine the value of the data to be read from the sub-array of 2-4.

Figure 24:
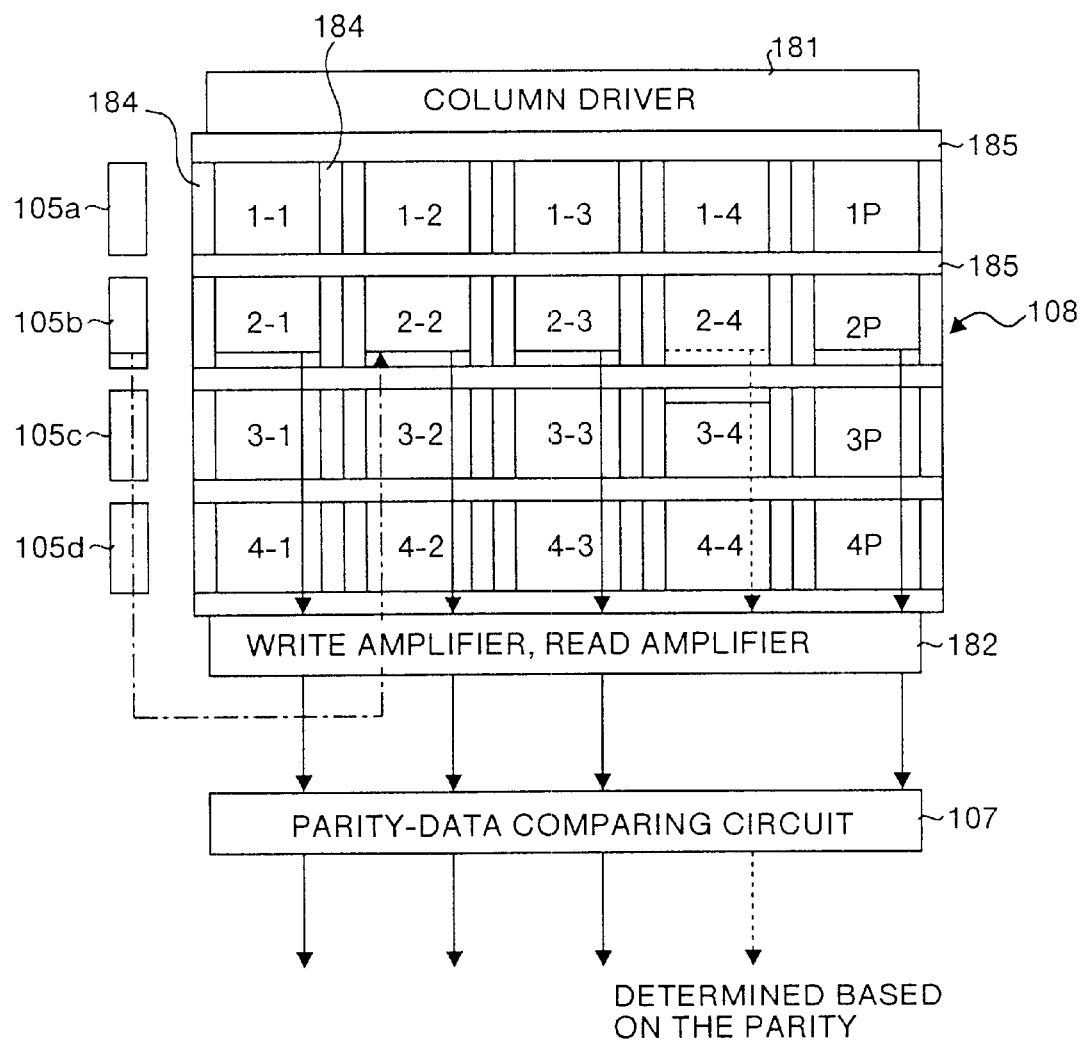
FIG. 24 is a diagram explaining the case (flag: 1) where a refresh operation and a data read operation are performed at the same time in a semiconductor memory according to the second embodiment of the present invention.

Next, explanations will be given about a case in which the refresh operation and the usual data read operation are performed at the same time and the flag of the data register 104 is 1 in the semiconductor memory 101 according to the second embodiment with reference to FIG. 24. In the example shown in FIG. 24, the block 2 is a subject of the data read similarly to the case of FIG. 20 and the sub-array of 3-4 is a subject of the refresh. Further, the data register 105b stores effective data to be originally stored in the sub-array 2-2 and the column address held in the data register does not coincide with the column address which is a subject of the read. In this case, the data read operation is the same as when the refresh operation and the data read operation are performed at the same time and the flag of the data register 104 is 0 (the case shown in FIG. 23). Then, since the flag of the data register 104 is 1, corresponding data from the data register 105b is rewritten in a proper memory cell and a corresponding flag is set to 0. When the column addresses coincide with each other, the data held in the register is output as correct data to the parity-data comparing circuit 107 in the same manner as in the case of FIG. 21.

Figure 25:
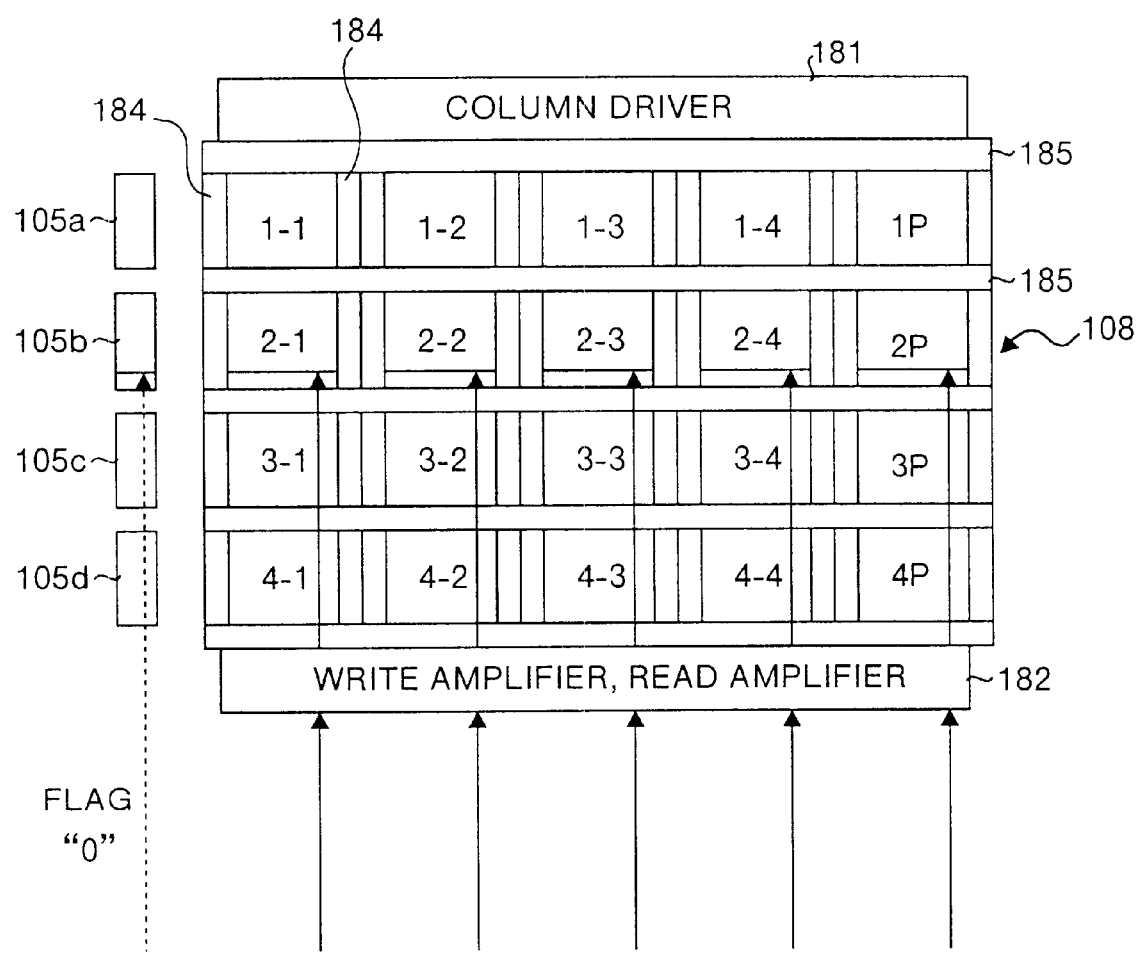
FIG. 25 is a diagram for explaining the case of performing a data write operation independently in a semiconductor memory according to the second embodiment of the present invention.

Next, explanations will be given about a case in which the usual data write operation is independently performed, specifically, the usual data write operation is performed independently without overlapping on the refresh operation in the semiconductor memory 101 according to the second embodiment with reference to FIG. 25. In the example shown in FIG. 25, the block 2 is a subject of the data write. For this reason, five sub-arrays 2-1, 2-2, 2-3, 2-4 and 2P belonging to the block 2 are activated. The data and the parity are written in a memory cell in each of these five sub-arrays. When the flag is 0, for example, an operation of rewrite of the data from the data register 105b and an operation of making the data held in the data register 105b invalid are not performed.

When the flag is 1, effective data is held in the register 105b and the column address held in the data register 105b corresponding to the row address of a memory cell which is a subject of the write coincide with the column address in a memory cell which is a subject of the write, a corresponding flag is set to 0 to make the data held in the data register 105b invalid. This is because data to be written in a proper memory cell afterwards is the latest data. When the column address held in the data register 105b corresponding to the row address of a memory cell which is a subject of the write does not coincide with the column address of a memory cell which is a subject of the write, the data is rewritten in a memory cell with the column address held in the data register 105b and a corresponding flag is set to 0.

Figure 26:
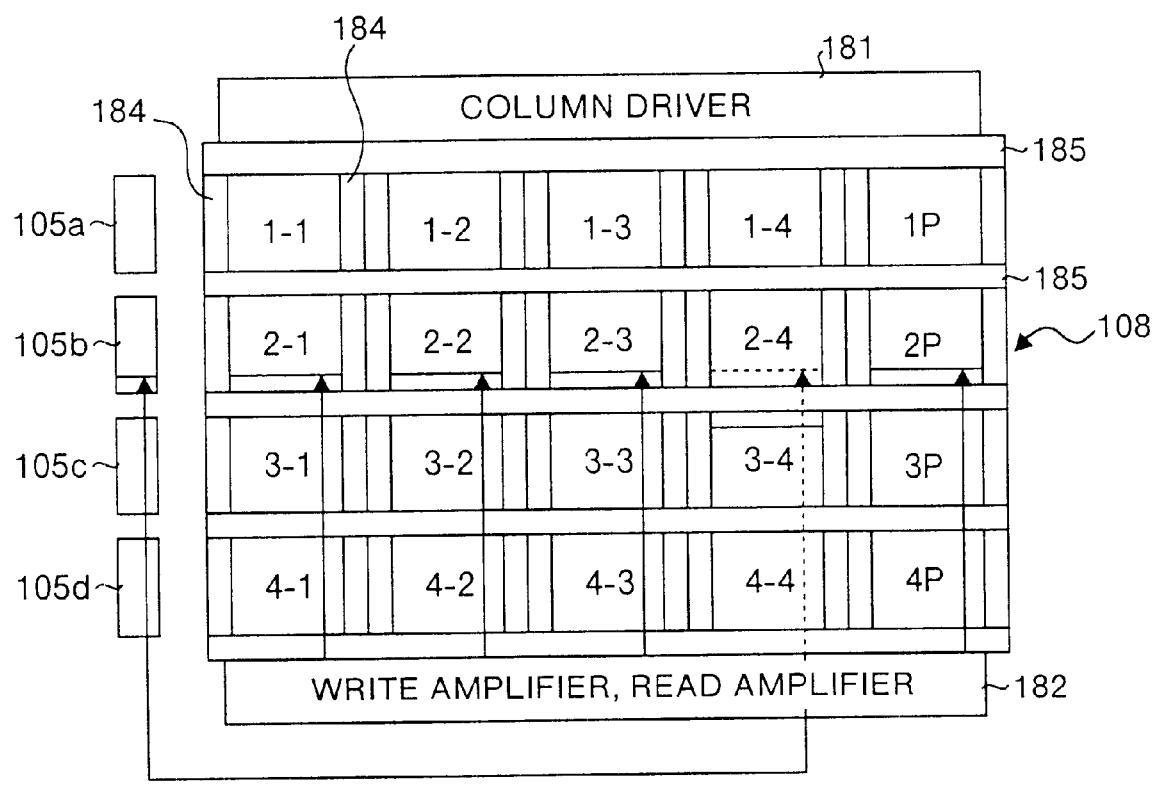
FIG. 26 is a diagram explaining the case (flag: 0) where a refresh operation and a data write operation are performed at the same time in a semiconductor memory according to the second embodiment of the present invention.

Next, explanations will be given about a case in which the refresh operation and the data write operation are performed at the same time and the flag of the data register 104 is 0 in the semiconductor memory 101 according to the second embodiment with reference to FIG. 26. In the example shown in FIG. 26, the block 2 is a subject of the data write similarly to the case of FIG. 25 and the sub-array of 3-4 is a subject of the refresh. The sub-array of 2-4 and the sub-array of 3-4 use the same sense amplifier in common, the sub-array of 3-4 which is a subject of the refresh is activated, but the sub-array of 2-4 is not activated. For this reason, data cannot be written in a memory cell in the sub-array of 2-4 and, therefore, the data to be originally written in memory cell in the sub-array of 2-4 is once written in the data register 105b with a corresponding row address. this time, the corresponding column address and the address of the sub-array are also stored in the data register 105b. Then, a corresponding flag is set to 1.

Figure 27:
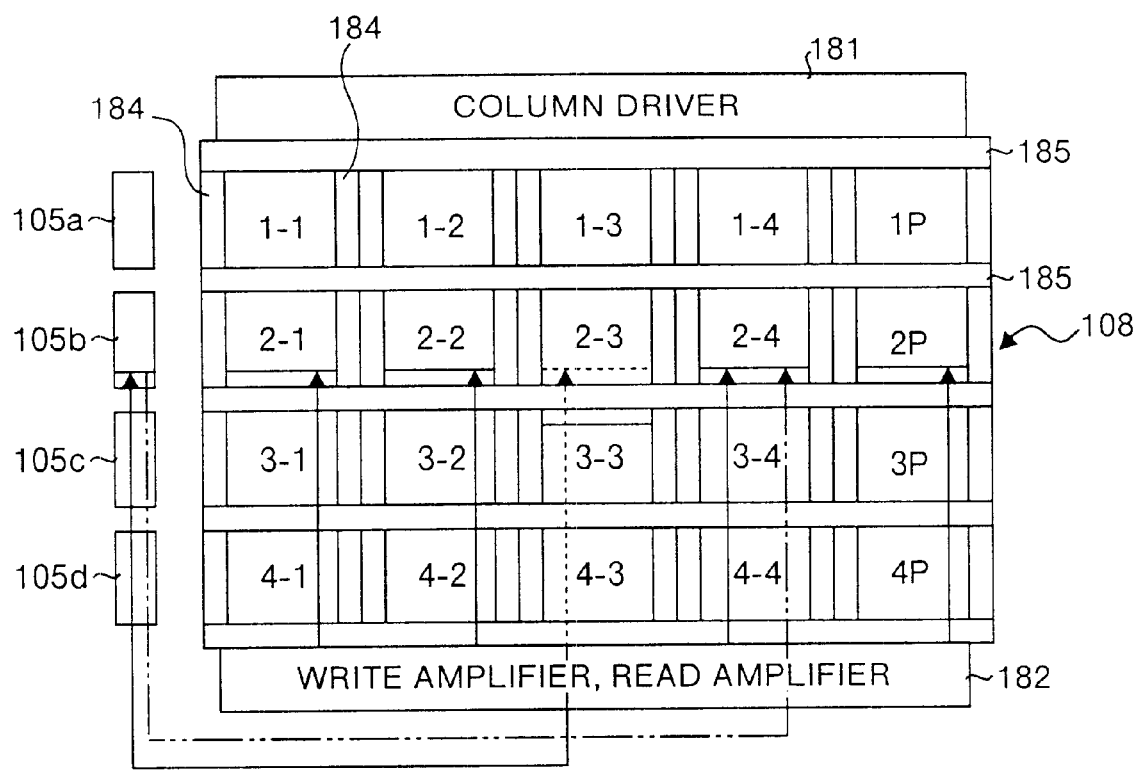
FIG. 27 is a diagram explaining the case (flag: 1) where a refresh operation and a data write operation are performed at the same time in a semiconductor memory according to the second embodiment of the present invention.

Next, explanations will be given about a case in which the refresh operation and the data write operation are performed at the same time and the flag of the data register 104 is 1 in the semiconductor memory 101 according to the second embodiment with reference to FIG. 27. In the example shown in FIG. 27, the block 2 is a subject of the data write and the sub-array of 3-3 is a subject of the refresh. Further, effective data to be originally stored in the sub-array of 2-4 is held in the data register 105b with a row address corresponding to a memory cell which is a subject of the write. When the column address held in the data register does not coincide with the column address which is a subject of the write, first the effective data held in the data register 105b is rewritten in a proper memory cell in the sub-array of 2-4 and a corresponding flag is set to 0.

Thereafter, in the same manner as when the refresh operation and the data write operation are performed at the same time and the flag of the data register 104 is 0 (the case shown in FIG. 26), data (the data of the sub-array of 2-3 in the example illustrated) which cannot be written in a proper memory cell because the refresh operation is given priority is stored in the data register 105b together with a corresponding column address and a corresponding number of the sub-array. Then, a corresponding flag is set to 1. It is to be noted that when the usual operation of writing data in a memory cell which has the same row address but is different from the effective data held in the data register 104, the effective data held in the data register 104 can also be rewritten in the same manner as above. When the column address held in the data register coincides with the column address which is a subject of the write, the data which cannot be written is stored in the data register in the same manner as in the case of FIG. 26 and a corresponding flag is kept 1 as it is.

According to the second embodiment, the same effect as obtained in the first embodiment can be obtained, specifically, the semiconductor memory is freed from refresh without using a cache memory. Therefore, the problem that a difference in the speed of the read operation and in the speed of the write operation caused by the hit or miss of the cache when acache memory is used to free a semiconductor memory from the refresh operation and the problem that the semiconductor memory is large-scaled or the degree of integration is decreased by disposing a large cache memory to lower the rate of cache miss can be solved.

Furthermore, the semiconductor memory 101 can be used as a storage of an SRAM interface in the same manner as in the first embodiment. Also, the semiconductor memory 101 may be used as a memory device which is the same as or similar to a DRAM interface and for which a refresh command from the outside is not required. Also, according to the second embodiment, the peak current consumption during refresh operation is more decreased than in the conventional case of performing refresh in the unit of block because a refresh operation is performed in the unit of sub-array. These facts show that the same effect as in the first embodiment is obtained.

It is to be noted that, in the second embodiment, explanation is given for a case in which the number of the blocks defined by a row address is four, as an example. However, the invention is not limited to this case and the number of the blocks may be three or less or five or more. Also, all of the structure of the memory cell array 108, the number of the sense amplifiers, the structure as to the connection between the sense amplifiers and the data buses, the refresh signal generating circuit 102, the parity generating circuit 106 and the parity-data comparing circuit 107 are not limited to the aforementioned structures and can be variously changed in design.

Also, instead of the flag for determining whether effective data is held in the data register 104 or not, the address held in the data register 104 may be compared with the address which is a subject of read or write to determine whether effective data is held in the data register 104 or not. Alternatively, the input or output of data to or from the data register 104 maybe controlled by a switching means. Further, the controller is made to store an address corresponding to effective data held in the data register 104 in advance and based on the stored address, whether the effective data is held in the data register 104 or not may be determined.

According to the present invention, when a refresh operation and a data read or write operation are carried out at the same time, data in a memory cell from which the data cannot be read is determined by a parity and data in a memory cell which cannot be written is rewritten in a proper memory cell after it is stored and held temporarily in a separate area. Accordingly, the semiconductor memory can be freed from refresh operation apparently without using a cache memory and, therefore, the problem which arises when the refresh operation of a semiconductor memory is freed using the cache memory can be solved. Specifically, the problem that a difference in the speed of the read operation and in the speed of the write operation caused by the hit or miss of the cache when a cache memory is used to free a semiconductor memory from the refresh operation and the problem that the semiconductor memory is large-scaled or the degree of integration is decreased by disposing a large cache memory to lower the rate of cache miss can be solved.

Although the invention has been described with respect to specific embodiments for a complete and clear disclosure, the appended claims are not to be thus limited, but are to be construed as embodying all modifications and alternative constructions that may occur to one skilled in the art which fairly fall within the basic teaching as herein set forth.

What is claimed is:

1. A semiconductor memory comprising:
    a parity generating unit which generates a first parity in accordance with a plurality of bits of write data;
    a memory cell array having a plurality of blocks which are simultaneously subjected to a data write or read operation, each block being provided with a plurality of sub-arrays storing the write data and one or more arrays storing the first parity, each of the plurality of sub-arrays being provided with a plurality of memory cells;
    a refresh unit which performs a refresh operation to each of the sub-arrays; and
    a parity-data comparing unit which compares the first party with a second parity generated by assuming that read data from at least one of the plurality of sub-arrays which cannot be accessed because at least one of the plurality of other blocks is activated by the refresh operation when the refresh operation and the data read operation are performed at the same time is 0 or 1, to determine the write data stored in the at least one of the plurality of sub-arrays.

2. The semiconductor memory according to claim 1, wherein the memory cell array is formed by arranging each of the plurality of sub-arrays included in the same block in a different block row.

3. The semiconductor memory according to claim 1, wherein the memory cell array is formed by arranging all of the plurality of sub-arrays included in the same block in the same block row.

4. A semiconductor memory comprising:
    a parity generating unit which generates a first parity in accordance with a plurality of bits of write data;
    a memory cell array having a plurality of blocks which are simultaneously subjected to a data write or read operation, each block being provided with a plurality of sub-arrays storing the write data an done or more arrays storing the first parity, each of the plurality of sub-arrays being provided with a plurality of memory cells;
    a refresh unit which performs a refresh operation to each of the plurality of sub-arrays; and
    a memory area which temporarily stores the write data corresponding to at least one of the plurality of sub-arrays, which cannot be accessed because at least one of the plurality of other blocks is activated by the refresh operation when the refresh operation and the data write operation are performed at the same time.

5. The semiconductor memory according to claim 4, wherein the memory cell array is formed by arranging each of the plurality of sub-arrays included in the same block in a different block row.

6. The semiconductor memory according to claim 4, wherein the memory cell array is formed by arranging all of the plurality of sub-arrays included in the same block in the same block row.

7. The semiconductor memory according to claim 4, wherein the memory area is provided with an area which stores write data and an area which stores at least one of a row address and a column address of a memory cell in which the write data is to be originally written.

8. The semiconductor memory according to claim 4, the semiconductor memory further comprising a rewrite control unit which rewrites the data, stored in the memory area, in a corresponding memory cell when the refresh operation and the data read or write operation are not performed at the same time.

9. The semiconductor memory according to claim 4, wherein the memory area is disposed in a row of each of the memory cell array.

10. The semiconductor memory according to claim 9, the semiconductor memory further comprising a rewrite control unit which rewrites the data, stored in the memory area, in a corresponding memory cell when, in case effective data is stored in the memory area, the successive data read or write operation is performed in a row including a memory cell in which the stored data is to be originally written.

11. A semiconductor memory comprising:
a parity generating unit which generates a first parity in accordance with a plurality of bits of written data;
a memory cell array having a plurality of blocks which are simultaneously subjected to a data write or read operation, each block being provided with a plurality of sub-arrays storing the write data and one or more arrays storing the first parity, each of the plurality of the sub-arrays being provided with a plurality of memory cells;
a refresh unit for performing a refresh operation to at least one of the plurality of sub-arrays;
a parity-data comparing unit which compares the first parity with a second parity generated by assuming that read data from at least one of the plurality of sub-arrays, which cannot be accessed because at least one of the plurality of other blocks is activated by the refresh operation when the refresh operation and data read operation are performed at the same time, is 0 or 1 to determine the write data stored in the at least one of the plurality of sub-arrays; and
a memory area which temporarily stores the write data corresponding to at least one of the plurality of sub-arrays which cannot be accessed because at least one of the plurality of other blocks is activated by the refresh operation when the refresh operation and the data write operation are performed at the same time.

12. The semiconductor memory according to claim 11, wherein at least one or more of the memory area is disposed in each column.

13. The semiconductor memory according to claim 11, the semiconductor memory further comprising a determining unit which determines whether the data stored in the memory area is effective or ineffective.

14. The semiconductor memory according to claim 11, the semiconductor further comprising a circuit which outputs effective data, which is stored in the memory area and is to be written in a memory cell which is being read, to a data bus corresponding to the memory cell in which the data is to be written when the data is read.

15. A memory access method comprising the steps of:
performing a refresh operation to each of the plurality of sub-arrays made by dividing blocks which are subjected to a read or write operation simultaneously;
generating a first parity in accordance with a plurality of bits of write data and storing the first parity; and
determining the write data stored in at least one of the plurality of sub-arrays by comparing the first parity with a second parity generated by assuming that read data from at least one of the plurality of sub-arrays, which data cannot be accessed because at least one of the plurality of other blocks is activated by the refresh operation when the refresh operation and data read operation are performed at the same time, is 0 or 1.

16. A memory access method comprising the steps of:
performing a refresh operation to each of the plurality of sub-arrays made by dividing blocks which are subjected to a write or read operation simultaneously;
generating a first parity in accordance with a plurality of bits of write data and storing the parity; and
temporarily storing and holding write data corresponding to at least one of the plurality of sub-arrays, which cannot be accessed because at least one of the plurality of other blocks is activated by the refresh operation when the refresh operation and data write operation are performed at the same time, in a memory area other than the plurality of sub-arrays.

17. The memory access method according to claim 16, wherein at least one of a row address and a column address of the memory cell in which the write data is to be originally written is stored in the memory area together with the write data.

18. The memory access method according to claim 16, the method further comprising a step of rewriting the data, stored in the memory area, in a corresponding memory cell when the refresh operation and the data read or write operation are not performed at the same time.

19. The memory access method according to claim 16, the method further comprising a step of rewriting the data, stored in the memory area, in a corresponding memory cell when, in case effective data is stored in the memory area, the successive data read or write operation is performed in a row including the memory cell in which the stored data is to be originally written.

20. A semiconductor memory comprising:
a parity generating unit which generates a parity in accordance with a plurality of bits of write data;
a memory cell array having a plurality of sub-arrays storing the write data and one or more arrays storing the parity;
a refresh unit which performs a refresh operation to one of the plurality of sub-arrays; and
a parity-data comparing unit which compares read data from the plurality of sub-arrays storing the write data, with the parity, to determine the write data when at least one of the plurality of sub-arrays cannot be accessed due to said refresh operation.

* * * * *

UNITED STATES PATENT AND TRADEMARK OFFICE
CERTIFICATE OF CORRECTION

PATENT NO.     : 6,421,292 B1
DATED          : July 16, 2002
INVENTOR(S)    : Kitamoto et al.

It is certified that error appears in the above-identified patent and that said Letters Patent is hereby corrected as shown below:

<u>Title page,</u>
Item [73], please change the address of the Assignee from "Kanagawa" to -- Kawasaki --.

Signed and Sealed this

Fourth Day of February, 2003

JAMES E. ROGAN
*Director of the United States Patent and Trademark Office*